(12) United States Patent
Jiang et al.

(10) Patent No.: US 12,306,506 B2
(45) Date of Patent: May 20, 2025

(54) ARRAY SUBSTRATE AND LIQUID CRYSTAL PANEL

(71) Applicants: Beijing BOE Optoelectronics Technology Co., Ltd., Beijing (CN); BOE Technology Group Co., Ltd., Beijing (CN); Shandong Lanbeisite Educational Equipment Group, Shandong (CN)

(72) Inventors: Kuo Jiang, Beijing (CN); Kai Lu, Beijing (CN); Xinyou Ji, Beijing (CN)

(73) Assignees: Beijing BOE Optoelectronics Technology Co., Ltd., Beijing (CN); BOE Technology Group Co., Ltd., Beijing (CN); Shandong Lanbeisite Educational Equipment Group, Beijing (CN)

( * ) Notice: Subject to any disclaimer, the term of this patent is extended or adjusted under 35 U.S.C. 154(b) by 0 days.

(21) Appl. No.: 18/727,353

(22) PCT Filed: Mar. 15, 2023

(86) PCT No.: PCT/CN2023/081727
§ 371 (c)(1),
(2) Date: Jul. 9, 2024

(87) PCT Pub. No.: WO2023/179434
PCT Pub. Date: Sep. 28, 2023

(65) Prior Publication Data
US 2025/0093715 A1  Mar. 20, 2025

(30) Foreign Application Priority Data
Mar. 25, 2022 (CN) .......................... 202210306927.2

(51) Int. Cl.
G02F 1/1333 (2006.01)
G02F 1/1362 (2006.01)
G02F 1/1368 (2006.01)

(52) U.S. Cl.
CPC .. G02F 1/136227 (2013.01); G02F 1/136286 (2013.01); G02F 1/1368 (2013.01)

(58) Field of Classification Search
CPC ........... G02F 1/13336; G02F 1/136286; G02F 1/1368
(Continued)

(56) References Cited

U.S. PATENT DOCUMENTS

2003/0003677 A1* 1/2003 Fukada ................. H01L 23/544
257/E23.179
2019/0067606 A1 2/2019 Han et al.
(Continued)

FOREIGN PATENT DOCUMENTS

CN   104570611 A   4/2015
CN   111443566 A   7/2020
(Continued)

*Primary Examiner* — Christopher M Raabe
(74) *Attorney, Agent, or Firm* — IPro, PLLC

(57) ABSTRACT

Provided is an array substrate, having a display region and a non-display region. The array substrate includes: a base and a plurality of patterned film layer structures laminated on the base. A portion of the patterned film layer structure disposed in the display region has a plurality of normal display regions arranged in an array and a first spliced display region between adjacent two normal display regions. The patterned film layer structure in a same layer includes a plurality of groups of scale patterns. A group of scale patterns includes two scale structures. The two scale structures are respectively disposed in adjacent two normal display regions. In a direction perpendicular to a length direction of the first spliced display region between the (Continued)

adjacent two normal display regions, a distance between the two scale structures is equal to a width of the first spliced display region.

20 Claims, 12 Drawing Sheets

(58) Field of Classification Search
USPC .......................................................... 349/33
See application file for complete search history.

(56) References Cited

U.S. PATENT DOCUMENTS

| | | |
|---|---|---|
| 2020/0194734 A1 | 6/2020 | Lee et al. |
| 2020/0295107 A1* | 9/2020 | Liu ....................... H10K 59/131 |
| 2024/0160058 A1* | 5/2024 | Li ....................... G09G 3/3406 |
| 2024/0192537 A1* | 6/2024 | Li ..................... G02F 1/133308 |
| 2024/0210747 A1* | 6/2024 | Ge ................... G02F 1/134309 |
| 2024/0355834 A1* | 10/2024 | Huang ................. G02F 1/1362 |

FOREIGN PATENT DOCUMENTS

| | | |
|---|---|---|
| CN | 111653207 A | 9/2020 |
| CN | 212380069 U | 1/2021 |
| CN | 113805425 A | 12/2021 |
| KR | 20050119359 A | 12/2005 |

\* cited by examiner

A-A'

ARRAY SUBSTRATE AND LIQUID CRYSTAL PANEL

CROSS-REFERENCE TO RELATED APPLICATION

The present disclosure a U.S. national stage of international application No. PCT/CN2023/081727, field on Mar. 15, 2023, which claims priority to Chinese Patent Application No. 202210306927.2, filed on Mar. 25, 2022, and entitled "ARRAY SUBSTRATE AND LIQUID CRYSTAL PANEL", the entire contents of which are herein incorporated by reference in their entireties.

TECHNICAL FIELD

The present disclosure relates to the field of display technology, and in particular, relates to an array substrate and a liquid crystal panel.

BACKGROUND

In order to meet people's viewing requirements on large-size images, a large-size display panel needs to be assembled in a display device.

SUMMARY

Embodiments of the present disclosure provide an array substrate and a liquid crystal panel. The technical solutions are as follows.

According to some embodiments of the present disclosure, an array substrate is provided. The array substrate has a display region and a non-display region at a periphery of the display region, and the array substrate includes:
  a base and a plurality of patterned film layer structures laminated on the base: wherein
  a portion of the patterned film layer structure disposed in the display region has a plurality of normal display regions arranged in an array and a first spliced display region between adjacent two normal display regions;
  the patterned film layer structure in a same layer includes a plurality of groups of scale patterns, wherein a group of scale patterns includes two scale structures, the two scale structures are respectively disposed in adjacent two normal display regions, and in a direction perpendicular to a length direction of the first spliced display region between the adjacent two normal display regions, a distance between the two scale structures is equal to a width of the first spliced display region.

In some embodiments, in the direction perpendicular to the length direction of the first spliced display region between the adjacent two normal display regions, the distance between the two scale structures is greater than 0).

In some embodiments, at least some of the plurality of patterned film layer structures form a plurality of sub-pixels: wherein orthographic projections of at least portions of the two scale structures on the base are respectively within orthographic projections of two sub-pixels of the plurality of sub-pixels on the base, and the two sub-pixels are arranged in a row direction or a column direction of the plurality of sub-pixels.

In some embodiments, a film layer structure closest to the base in the plurality of patterned film layer structures is a first conductive layer: wherein the scale structure in the first conductive layer includes: a first strip-shaped structure, wherein length directions of the two first strip-shaped structures in a group of scale patterns are parallel.

In some embodiments, the scale structure in the first conductive layer further includes: at least one protruding structure connected to the first strip-shaped structure: wherein
  a number of the at least one protruding structure in the first strip-shaped structure is within a preset number range.

In some embodiments, the scale structure includes a plurality protruding structures, and the plurality of protruding structures and the first strip-shaped structure form a comb-shaped structure.

In some embodiments, the scale structures in film layer structures other than the first conductive layer in the plurality of patterned film layer structures each include: a second strip-shaped structure, wherein a length direction of the second strip-shaped structure is parallel to the length direction of the first strip-shaped structure.

In some embodiments, the film layer structures other than the first conductive layer in the plurality of patterned film layer structures each include a second strip-shaped structure corresponding to a same first strip-shaped structure: wherein an orthographic projection of at least a portion of the same first strip-shaped structure on the base and an orthographic projection of at least a portion of each corresponding second strip-shaped structure on the base are within an orthographic projection of a same sub-pixel on the base, and the orthographic projection of the first strip-shaped structure on the base is not overlapped with the orthographic projection of each corresponding second strip-shaped structure on the base.

In some embodiments, the orthographic projections of the second strip-shaped structures in different patterned film layer structures on the base are not overlapped with each other.

In some embodiments, the film layer structures other than the first conductive layer in the plurality of patterned film layer structures are respectively: an active layer pattern, a second conductive layer, a first insulating layer, a pixel electrode layer, a second insulating layer and a support pattern, wherein the active layer pattern, the second conductive layer, the first insulating layer, the pixel electrode layer, the second insulating layer and the support pattern are sequentially laminated in a direction perpendicular to and away from the base:
  the array substrate further includes: a gate insulating layer disposed in an entire layer between the active layer pattern and the first conductive layer;
  the second strip-shaped structures in the active layer pattern, the second conductive layer, the pixel electrode layer and the support pattern are strip-shaped protrusions; and the second strip-shaped structures in the first insulating layer and the second insulating layer are strip-shaped grooves.

In some embodiments, a length of the second strip-shaped structure in the support pattern is greater than a length of the first strip-shaped structure, and in the direction perpendicular to the length direction of the first spliced display region between the adjacent two normal display regions, a distance between the two second strip-shaped structures in the group of scale patterns is less than a width of one sub-pixel.

In some embodiments, an orthographic projection of a portion of the second strip-shaped structure in the support pattern on the base and an orthographic projection of a corresponding first strip-shaped structure on the base are within an orthographic projection of a same sub-pixel on the base: an orthographic projection of another portion of the second strip-shaped structure in the support pattern on the base and an orthographic projection of a corresponding first strip-shaped structure on the base are within orthographic projections of different sub-pixels on the base, and orthographic projections of other portions of the two second strip-shaped structures in the group of scale patterns on the base are within orthographic projections of a same sub-pixel on the base.

In some embodiments, the first conductive layer further includes: a gate electrode of a thin film transistor in the sub-pixel and a gate line electrically connected to the gate electrode:
the active layer pattern further includes: an active layer of the thin film transistor in the sub-pixel;
the second conductive layer further includes: a first electrode and a second electrode of the thin film transistor in the sub-pixel and a data line electrically connected to the first electrode;
the first insulating layer is further provided with a connection via;
the pixel electrode layer further includes a pixel electrode in the sub-pixel, wherein the pixel electrode is electrically connected to the second electrode through the connection via;
the support pattern further includes a plurality of support pillars arranged in an array.

In some embodiments, a pixel electrode of which an orthographic projection on the base is overlapped with an orthographic projection of the second strip-shaped structure in the pixel electrode layer on the base is provided with a hollow structure, and the orthographic projection of the second strip-shaped structure in the pixel electrode layer on the base is within an orthographic projection of the hollow structure on the base.

In some embodiments, the first conductive layer further includes an auxiliary signal line; wherein there is an overlapping region between an orthographic projection of the auxiliary signal line on the base and an orthographic projection of the pixel electrode in the sub-pixel on base, and the orthographic projection of the auxiliary signal line on the base is not overlapped with an orthographic projection of the first strip-shaped structure on the base.

In some embodiments, the group of scale patterns is further provided with two marker structures in one-to-one correspondence with the two scale structures, wherein the scale structure is closer to the first spliced display region than the corresponding marker structure is.

In some embodiments, at least some of the plurality of patterned film layer structures form a plurality of sub-pixels, and the plurality of sub-pixels include: a plurality of first sub-pixels disposed in the display region and a plurality of dummy sub-pixels disposed in the non-display region: wherein
an area of an orthographic projection of a pixel electrode in the dummy sub-pixel on the base is greater than an area of an orthographic projection of a pixel electrode in the first sub-pixel on the base.

In some embodiments, a plurality of first sub-pixels are disposed in the normal display region, and the plurality of sub-pixels further include a plurality of second sub-pixels and a plurality of third sub-pixels, wherein the plurality of second sub-pixels are all disposed in the first spliced display region, a portion of the third sub-pixel is disposed in the normal display region, and another portion of the third sub-pixel is disposed in the first spliced display region; wherein an area of an orthographic projection of a pixel electrode in the second sub-pixel on the base is less than or equal to the area of the orthographic projection of the pixel electrode in the first sub-pixel on the base;
in a direction parallel to the length direction of the first spliced display region, a width of the portion of the third sub-pixel disposed in the first spliced display region is less than or equal to a width of the portion of the third sub-pixel disposed in the normal display region.

In some embodiments, the portion of the patterned film layer structure disposed in the display region further includes: a second spliced display region, wherein the second spliced display region is between two first spliced display regions arranged along a row direction and between two first spliced display regions arranged along a column direction, and the plurality of sub-pixels further includes: a fourth sub-pixel disposed in the second spliced display region; wherein
an area of an orthographic projection of a pixel electrode in the fourth sub-pixel on the base is less than or equal to the area of the orthographic projection of the pixel electrode in the second sub-pixel on the base.

According to some embodiments of the present disclosure, a liquid crystal panel is provided. The liquid crystal panel includes: an array substrate and a cover plate facing each other, and a liquid crystal layer disposed between the array substrate and the cover plate, wherein the array substrate is any one of the array substrates described above.

BRIEF DESCRIPTION OF DRAWINGS

For clearer descriptions of the technical solutions in the embodiments of the present disclosure, the following briefly introduces the accompanying drawings required for describing the embodiments. The accompanying drawings in the following descriptions show merely some embodiments of the present disclosure, and persons of ordinary skill in the art may still derive other drawings from these accompanying drawings without creative effort.

DETAILED DESCRIPTION

To make the objectives, technical solutions and advantages of the present disclosure clearer, the embodiments of the present disclosure will be further described in detail below with reference to the accompanying drawings.

At present, when a large-size display panel is manufactured, a patterned film layer structure in the display panel generally needs to be formed by splicing and exposure processes.

For example, when a patterned film layer structure in a large-size display panel is to be manufactured, firstly, it is necessary to form a film layer structure disposed in an entire layer on a substrate and coat photoresist; next, different partitions of the photoresist are respectively exposed once by using the same mask; then, the exposed photoresist is developed, and the film layer structure disposed in the entire layer on the base is etched; and finally, the photoresist on the base is stripped to form a patterned film layer structure on the base.

However, at present, when the photoresist film on the base is exposed, the splicing regions between the respective partitions may have different widths, resulting in a poor display effect of the large-size display panel that is formed subsequently.

Figure 1:
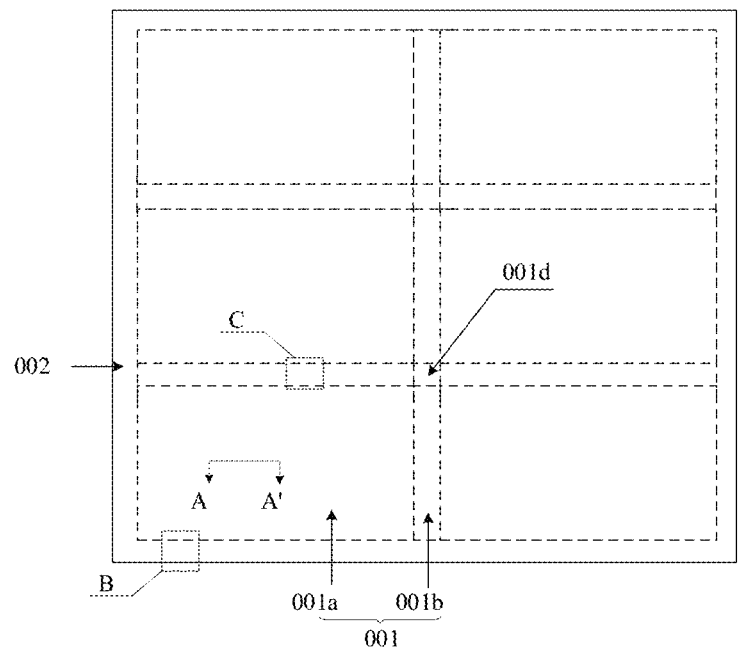
FIG. 1 is a top view of an array substrate according to some embodiments of the present disclosure.
Figure 2:
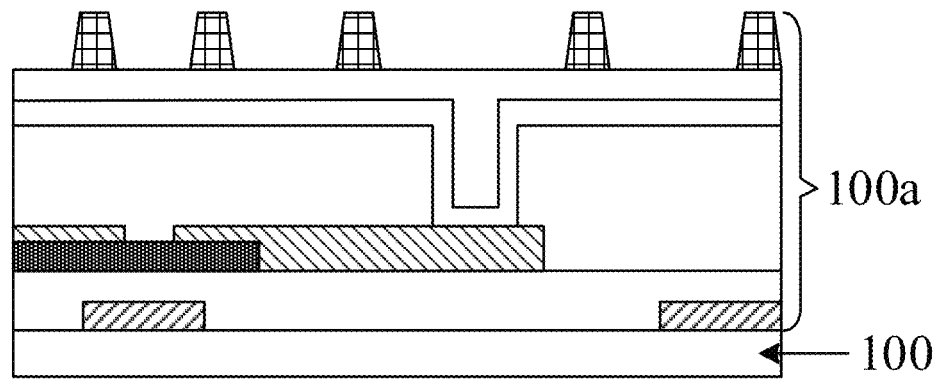
FIG. 2 is a schematic diagram of a film layer structure at position A-A' of the array substrate shown in FIG. 1.

FIG. 1 is a top view of an array substrate according to some embodiments of the present disclosure. Referring to FIG. 1, the array substrate 000 has a display region 001 and a non-display region 002 disposed at a periphery of the display region 001. For a clearer view of the film layer structure of the array substrate 000, please refer to FIG. 2, and FIG. 2 is a schematic diagram of a film layer structure at position A-A' of the array substrate shown in FIG. 1. The array substrate 000 includes a base 100 and a plurality of patterned film layer structures 100a laminated on the base 100. At least some of the plurality of patterned film layer structures 100a form a plurality of sub-pixels.

Figure 3:
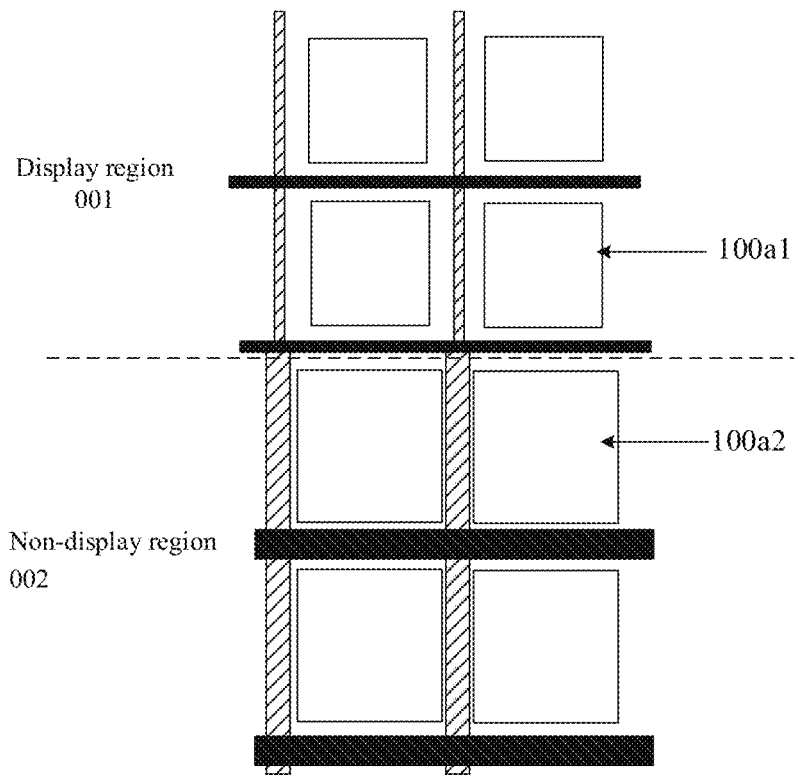
FIG. 3 is a local enlarged view of the array substrate shown in FIG. 1 at position B.

For a clearer view of the structures of the plurality of sub-pixels, please refer to FIG. 3, and FIG. 3 is a local enlarged view of the array substrate shown in FIG. 1 at position B. The plurality of sub-pixels include a plurality of first sub-pixels 100a1 disposed in the display region 001 and a plurality of dummy sub-pixels 100a2 disposed in the non-display region 002. The area of the orthographic projection of a pixel electrode in the dummy sub-pixel 100a2 on the base 100 is greater than the area of the orthographic projection of a pixel electrode in the first sub-pixel 100a1 on the base 100.

It should be noted that, in the embodiments of the present disclosure, the area of the orthographic projection of the pixel electrode in the sub-pixel on the base refers to the area of the region enclosed by the outer contour of the orthographic projection of the pixel electrode on the base. It should be further noted that the embodiments of the present disclosure are described by taking an example in which the area of the orthographic projection of the pixel electrode in each dummy sub-pixel disposed in the non-display region on the base is greater than the area of the orthographic projection of the pixel electrode in the first sub-pixel on the base. In other possible implementations, the areas of the orthographic projections of the pixel electrodes in some of the dummy sub-pixels disposed in the non-display region on the base are greater than the area of the orthographic projection of the pixel electrode in the first sub-pixel on the base, and the areas of the orthographic projections of the pixel electrodes in the other dummy sub-pixels of the dummy sub-pixels on the base are equal to the area of the orthographic projection of the pixel electrode in the first sub-pixel on the base, which is not limited in the embodiments of the present disclosure.

Figure 4:
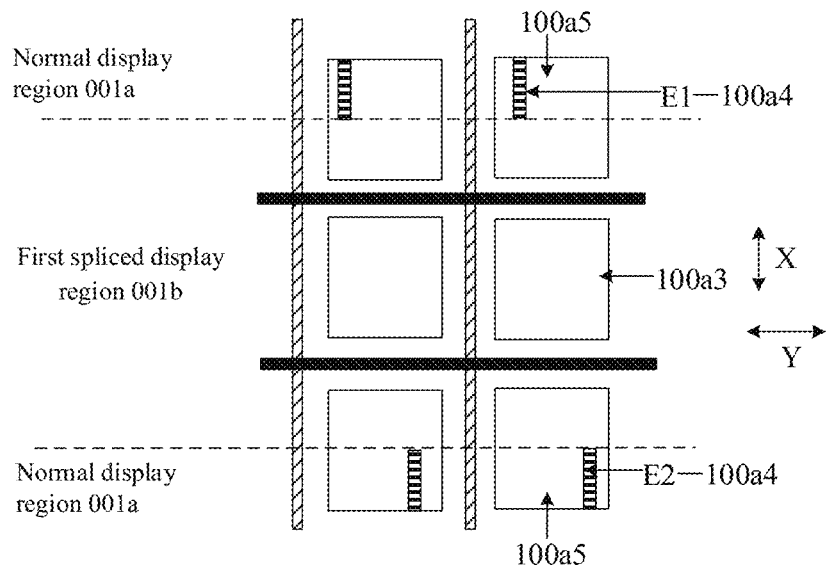
FIG. 4 is a local enlarged view of the array substrate shown in FIG. 1 at position C.

As shown in FIG. 3 and FIG. 4, FIG. 4 is local enlarged view of the array substrate shown in FIG. 1 at position C. The portion of each patterned film layer structure 100a disposed in the display region 001 has a plurality of normal display regions 001a arranged in an array and a first spliced display region 001b disposed between adjacent two normal display regions 001a. The plurality of normal display regions 001a in the display region 001 are arranged in an array in at least one row and/or at least one column. FIG. 1 schematically illustrates that the plurality of normal display regions 001a in the display region 001 are arranged in three rows and two columns. The plurality of first sub-pixels 100a1 are all disposed in the normal display regions 001a. The plurality of sub-pixels formed of at least some of the plurality of patterned film layer structures 100a further include a plurality of second sub-pixels 100a3 disposed in the first spliced display region 001b. Here, the area of the orthographic projection of the pixel electrode in the dummy sub-pixel 100a2 on the base 100 is also greater than the area of the orthographic projection of the pixel electrode in the second sub-pixel 100a3 on the base 100.

In the embodiments of the present disclosure, as shown in FIG. 4, the plurality of sub-pixels formed of at least some of the plurality of patterned film layer structures 100a further include a plurality of third sub-pixels 100a5. Here, a portion of the third sub-pixel 100a5 is disposed in the normal display region 001a, and the other portion of the third sub-pixel 100a5 is disposed in the first spliced display region 001b. In this case, a portion of the boundary line between the first spliced display region 001b and the normal display region 001a in the array substrate 000 is disposed in the region where the third sub-pixel 100a5 is disposed.

The patterned film layer structure 100a in the same layer includes a plurality of groups of scale patterns 100a4. A group of scale patterns 100a4 includes two scale structures (E1, E2), and the two scale structures (E1, E2) are respectively disposed in adjacent two normal display regions 001a.

In a direction perpendicular to the length direction of the first spliced display region 001*b* between the adjacent two normal display regions 001*a*. i.e., in the X direction shown in FIG. 4, the distance between the two scale structures (E1, E2) is equal to the width of the first spliced display region 001*b*. Here, the two scale structures (E1, E2) are respectively disposed in the third sub-pixels 100*a*5 in the adjacent two normal display regions 001*a*.

In the embodiments of the present disclosure, in each patterned film layer structure 100*a* of the array substrate 000, the portion disposed in the normal display region 001*a* is formed based on a first mask of a mask plate, the portion disposed in the non-display region 002 is formed based on a second mask of the mask plate, and the portion disposed in the first spliced display region 001*b* is formed based on the first mask and the second mask. Here, the first mask and the second mask are masks in different regions of the same mask plate.

Figure 5:
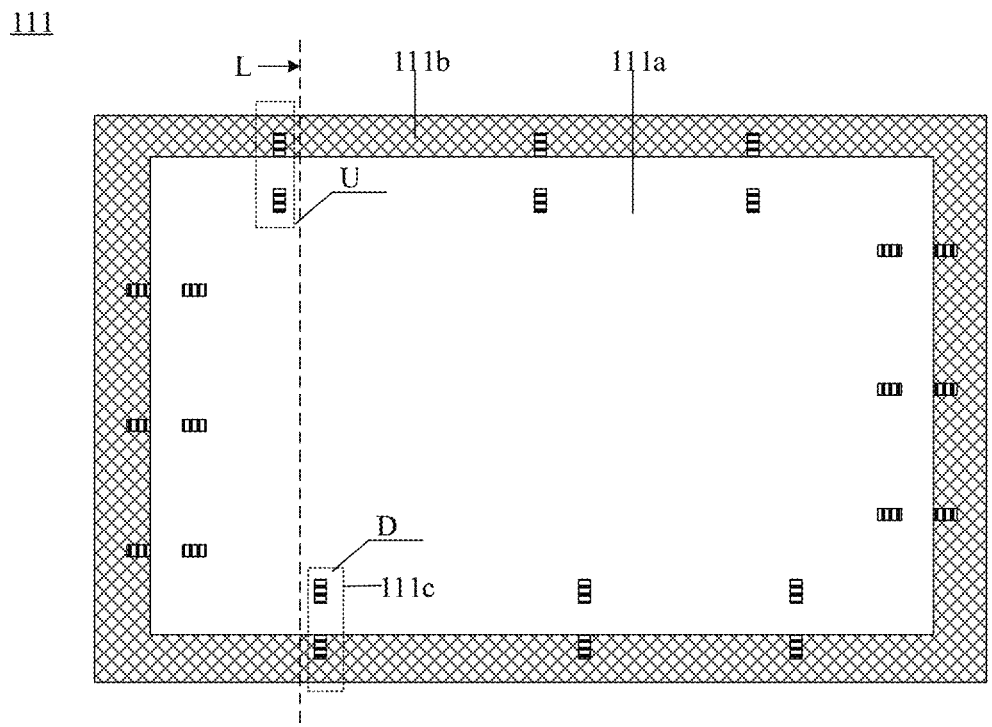
FIG. 5 is a schematic structural diagram of a mask plate according to some embodiments of the present disclosure.

For example. FIG. 5 is a schematic structural diagram of a mask plate according to some embodiments of the present disclosure. As shown in FIG. 5, the mask plate 111 includes a first mask 111*a* and a second mask 111*b* distributed around the first mask 111*a*. In the process of forming the patterned film layer structure 100*a* of the array substrate 000, after a photoresist film in an entire layer is formed on the base 100, the first mask 111*a* of the mask plate 111 is used for exposing the portions of the photoresist film that are disposed in the normal display region 001*a* and the first spliced display region 001*b*, and the second mask 111*b* of the mask plate 111 is used for exposing the portions of the photoresist film that are disposed in the first spliced display region 001*b* and the non-display region 002.

The mask plate 111 further includes a plurality of groups of mask scales 111*c*. In the plurality of groups of mask scales 111*c*, two groups of mask scales 111*c* on two opposite sides of the mask plate 111 are disposed at different positions. For example, the two groups of mask scales 111*c* are distributed on two sides of a center line L. It should be noted that the center line L is a virtual line, which is merely used to indicate the positional relationship between the two groups of mask scales 111*c*, and does not exist in the mask pattern of the mask plate 111.

Figure 6:
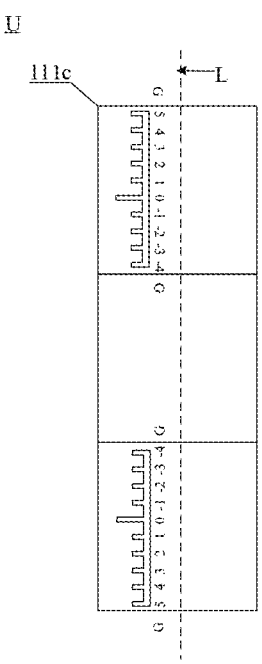
FIG. 6 is a schematic diagram of mask scales at position U shown in FIG. 5.
Figure 7:
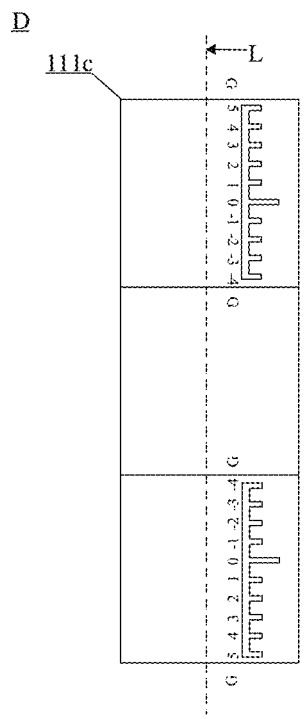
FIG. 7 is a schematic diagram of mask scales at position D shown in FIG. 5.

For a clearer view of the mask scale on the mask plate 111, referring to FIG. 6 and FIG. 7. FIG. 6 is a schematic diagram of the mask scales at position U shown in FIG. 5, and FIG. 7 is a schematic diagram of the mask scales at position D shown in FIG. 5. Each group of mask scales 111*c* includes two scales, a pattern of the first mask 111*a* or a pattern of the second mask 111*b* is arranged between the two scales, and the extension lines of the two scales are completely overlapped. For example, the group of mask scales 111*c* at position U is distributed on the left side of the center line L, and the group mask scales 111*c* at position D is distributed on the right side of the center line L.

In this way, in the process of forming the patterned film layer structure 100*a* in the array substrate 000, after the photoresist film in the entire layer is formed on the base, the two groups of mask scales 111*c* disposed on two sides of the center line L form a group of scale patterns 100*a*4 on two sides of the first spliced display region 001*b* in the array substrate 000. In addition, the scales in the group of mask scales 111*c* at position D form the scale structure E1 on a side of the first spliced display region 001*b* in the array substrate 000; and the scales in the group of mask scales 111*c* at position U form the scale structure E2 on the other side of the first spliced display region 001*b* in the array substrate 000. As such, in the Y direction parallel to the length direction of the first spliced display region 001*b* between the adjacent two normal display regions 001*a*, the distance between the two scale structures (E1, E2) is greater than 0).

It should be noted that each of the patterned film layer structures 100*a* in the array substrate 000 is formed based on a mask of the mask plate. For example, when a patterned film layer structure in the array substrate 000 needs to be formed, firstly, a film layer structure in an entire layer is formed on the base 100 and is coated with a photoresist film: then, an exposure is performed on the portions of the photoresist film that are disposed in the plurality of normal display regions 001*a* using the same mask plate: next, the exposed photoresist film is developed, and the film layer structure in the entire layer is etched; and finally, the photoresist on the substrate is stripped to form a patterned film layer structure on the base 100.

Performing an exposure on the portion of the photoresist film that is disposed in one normal display region includes: forming a first exposure region in a first normal display region and a target spliced display region using the first mask of the mask plate, and forming a second exposure region in the non-display region and the target spliced display region using the second mask of the mask plate; and moving the mask plate towards a second normal display region until the first mask covers the second exposure region in the second normal display region and the target spliced display region and the second mask covers the first exposure region in the target spliced display region. The first normal display region is any normal display region of the plurality of normal display regions 001*a*, the second normal display region is a normal display region adjacent to the first normal display region, and the target spliced display region is a first spliced display region between the first normal display region and the second normal display region.

It should be noted that, after the photoresist film is exposed by using the masks of the mask plate, exposure regions are formed in the photoresist film. Subsequently, after the exposed photoresist film is developed, the photoresist outside the exposure regions in the photoresist film is removed, and the photoresist in the exposure regions is retained, thereby acquiring a photoresist pattern. Therefore, in the patterned film layer structure 100*a* formed based on the same mask plate in the array substrate 000, the portion disposed in the normal display region 001*a* is formed based on the first mask of the mask plate, the portion disposed in the non-display region 002 is formed based on the second mask of the mask plate, and the portion disposed in the first spliced display region 001*b* is formed based on the first mask and the second mask of the mask plate.

It should also be noted that the first mask and the second mask of the mask plate are similar in shape, but the unit area of the second exposure region formed by exposing the photoresist film using the second mask of the mask plate is greater than the unit area of the first exposure region formed by exposing the photoresist film using the first mask of the mask plate. Therefore, in the patterned film layer structure 100*a* formed based on the same mask plate in the array substrate 000, the unit area of the partial pattern disposed in the non-display region 002 is greater than the unit area of the partial pattern disposed in the normal display region 001*a*, and thus the area of the orthographic projection of the dummy sub-pixel 100*a*2 disposed in the non-display region 002 on the base 100 is greater than the area of the orthographic projection of the first sub-pixel 100*a*1 disposed in the normal display region 001*a* on the base 100. It should be noted that, in the embodiments of the present disclosure, the unit area of a pattern refers to the area of the pattern in the same region. For example, the region is a sub-pixel region in the array substrate 000.

Figure 8:
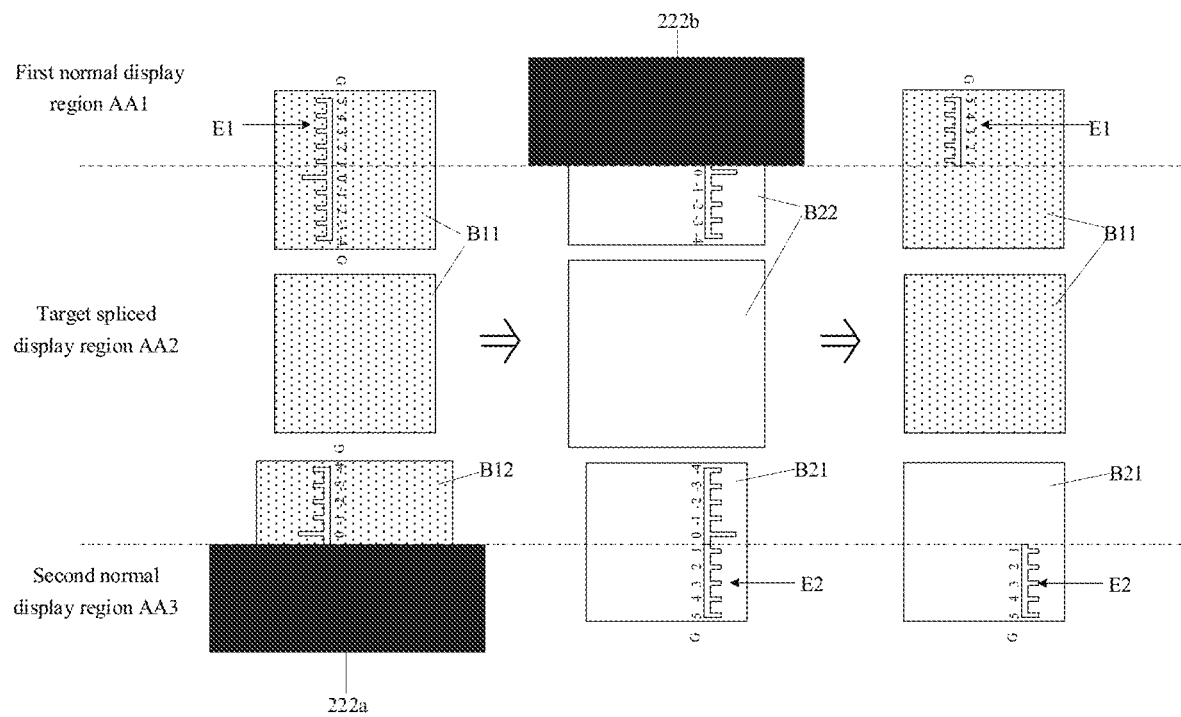
FIG. 8 is a schematic diagram of performing two exposures on a target first spliced display region according to some embodiments of the present disclosure.

In the embodiments of the present disclosure, the portion of the photoresist film that is disposed in the first spliced display region is exposed twice. For example. FIG. 8 is a schematic diagram of performing two exposures on a target first spliced display region according to some embodiments of the present disclosure. As shown in FIG. 8, in the process of performing the exposure on the portion of the photoresist film disposed in the first normal display region AA1 using the first mask of the mask plate, a first exposure is performed on the photoresist in the target spliced display region AA2 using the first mask, the second mask, and the group of mask scales 111c at position D in the mask plate, to form the first exposure region B11 and the second exposure region B12 in the portion of the photoresist film disposed in the target spliced display region AA2. In the process of performing the exposure on the portion of the photoresist film disposed in the second normal display region AA3 using the first mask of the mask plate, a second exposure is performed on the photoresist in the target spliced display region AA2 using the first mask, the second mask, and the group of mask scales 111c at position U in the mask plate, to form the first exposure region B21 and the second exposure region B22 in the portion of the photoresist film disposed in the target spliced display region AA2.

Here, in the portion of the photoresist film disposed in the target spliced display region AA2, the center point of the first exposure region B11 formed in the first exposure coincides with the center point of the second exposure region B22 formed in the second exposure, and the center point of the second exposure region B12 formed in the first exposure coincides with the center point of the first exposure region B21 formed in the second exposure. In addition, the unit area of the first exposure region is smaller than the unit area of the second exposure region. Therefore, after two exposures are performed on the portion of the photoresist film disposed in the target spliced display region AA2 and after the photoresist film is developed, only the photoresist in the first exposure regions with a smaller unit area is retained, that is, only the photoresist in the first exposure region B11 formed in the first exposure and in the first exposure region B21 formed in the second exposure is retained. It should be noted that in FIG. 8, the pattern filled with dots represents the exposure region formed in the first exposure, and the white pattern represents the exposure region formed in the second exposure. In addition, in FIG. 8, the first column of exposure regions represent the exposure regions formed only through the first exposure, the second column of exposure regions represent the exposure regions formed only through the second exposure, and the third column of exposure regions represent the exposure regions formed through the two exposures.

In this way: in the patterned film layer structure 100a formed based on the same mask plate in the array substrate 000, the unit area of the partial pattern disposed in the first spliced display region 001b is smaller than the unit area of the partial pattern disposed in the non-display region 002. Therefore, the area of the orthographic projection of the pixel electrode in the second sub-pixel 100a3 in the first spliced display region 001b on the base 100 is smaller than the area of the orthographic projection of the pixel electrode in the dummy sub-pixel 100a2 disposed in the non-display region 002 on the base 100.

In order to manufacture two scale structures (E1, E2) in two adjacent normal display regions 001a in the patterned film layer structure 100a in the same layer so as to control the width of the first spliced display region 001b disposed between the two scale structures (E1, E2), a portion of the second mask of the mask plate needs to be shielded by a shielding plate in the process of performing the exposures on the photoresist film using the mask plate, which is described in detail below:

In the process of performing the exposure on the portion of the photoresist film disposed in the first normal display region AA1 using the first mask 111a and the group of mask scales 111c at position D in the mask plate 111, the portion, close to the second normal display region AA3, of the second mask 111b of the mask plate 111 is shielded by using a first shielding plate 222a. In addition, in the process of performing the exposure on the portion of the photoresist film disposed in the second normal display region AA3 using the first mask 111a and the group of mask scales 111c at position U in the mask plate 111, the portion, close to the first normal display region AA1, of the second mask 111b of the mask plate 111 is shielded by using a second shielding plate 222b. The first shielding plate 222a and the second shielding plate 222b have the same size, and are only defined in respect of shielding different positions of the mask plate 111.

Assuming that the film layer structure in two rows of sub-pixels can be formed based on the second mask 111b of the mask plate 111, and assuming that the exposure performed on the portion of the photoresist film disposed in the target spliced display region AA2 is the first exposure while the portion of the photoresist film disposed in the first normal display region AA1 is exposed using the first mask 111a of the mask plate 111, and the exposure performed on the portion of the photoresist film disposed in the target spliced display region AA2 is the second exposure while the portion of the photoresist film disposed in the second normal display region AA3 is exposed using the first mask 111a of the mask plate 111, then in the process of performing the first exposure on the target spliced display region AA2, the target first spliced display region AA2 needs to be exposed using the portion of the first mask 111a of the mask plate 111 which is used to form one and a half rows of sub-pixels so as to form the first exposure region B11 in the target spliced display region AA2; and the portion of the second mask 111b of the mask plate 111 which is used to form one and a half rows of sub-pixels needs to be shielded by using the first shielding plate 222a such that the target spliced display region AA2 is exposed using the portion of the second mask 111b that is not shielded, so as to form the second exposure region B12 in the target spliced display region AA2. Subsequently, one and a half rows of sub-pixels can be formed based on the first exposure region B11, and a half row of sub-pixels can be formed based on the second exposure region B12. The first normal display region AA1 and the target spliced display region AA2 are exposed using the two scales in the group of mask scales 111c at position D, so as to form one scale structure E1 in half of a sub-pixel region in the first exposure region B11 and in half of a sub-pixel region in the first normal display region AA1 and form half of a scale structure E1 in the second exposure region B12. Subsequently, after the second exposure, only half of a scale structure E1 is retained in half of a sub-pixel region in the first normal display region AA1.

In the process of performing the second exposure on the target spliced display region AA2, the target spliced display region AA2 needs to be exposed using the portion of the first mask 111a of the mask plate 111 which is used to form a half row of sub-pixels, so as to form the first exposure region B21 in the target spliced display region AA2; and the portion of the second mask 111b of the mask plate 111 which is used to form the half row of sub-pixels needs to be shielded by using the second shielding plate 222b, such that the target spliced display region AA2 is exposed using the portion of the second mask 111b that is not shielded, so as to form the second exposure region B22 in the target spliced display region AA2. If the influence of the first exposure is not considered, a half row of sub-pixels can be subsequently formed based on the first exposure region B21, and one and a half rows of sub-pixels can be subsequently formed based on the second exposure region B22. If the influence of the first exposure is not considered, the second normal display region AA3 and the target spliced display region AA2 are exposed using the two scales in the group of mask scales 111c at position U, so as to form one scale structure E2 in half of a sub-pixel region in the first exposure region B21 and in half of a sub-pixel region close to the first normal display region AA1 in the second exposure region B22. Under the influence of the first exposure, only half of a scale structure E2 in half of a sub-pixel region in the second normal display region AA3 is retained.

In this case, if the influences of the two exposures are considered at the same time, in respect of the sizes of the exposure regions, after the first exposure region B11 is formed by the first exposure, the region where the first exposure region B11 is disposed is the same as the region where the second exposure region B22 formed by the subsequent second exposure is disposed, and the area of the first exposure region B11 is smaller than the area of the second exposure region B22. Therefore, the second exposure region B22 formed by the second exposure does not affect the area of the first exposure region B11 formed by the first exposure. Similarly, after the second exposure region B12 is formed by the first exposure, the region where the second exposure region B12 is disposed is the same as the region where the first exposure region B21 formed by the subsequent second exposure is disposed, and the area of the second exposure region B12 is greater than the area of the first exposure region B21. Therefore, the second exposure region B12 formed by the first exposure is processed by the second exposure as the first exposure region B21. In this way, it can be ensured that after the portion of the photoresist film disposed in the target spliced display region AA2 is exposed twice and after the photoresist film is developed, only the photoresist in the first exposure region B11 formed in the first exposure and in the first exposure region B12 formed in the second exposure is retained.

If the influences of the two exposures are considered at the same time, in respect of the distribution of the scale structures, after the first exposure region B11 is formed by the first exposure and the second exposure region B22 is formed by the second exposure, the orthographic projection of the half of the scale structure E1 in half of a sub-pixel region in the first exposure region B11 on the base 100 is not overlapped with the orthographic projection of the half of the scale structure E2 formed in half of a sub-pixel region close to the first normal display region AA1 in the second exposure region B22 on the base 100. Therefore, after the second exposure, the scale structures (E1, E2) are not retained in the first exposure region B11. However, in the second exposure, the second shielding plate 222b shields the portion of the second mask 111b of the mask plate 111 that is used to form a half row of sub-pixels, such that a half of the scale structure E1 is retained in half of a sub-pixel region in the first normal display region AA1. Similarly, after the second exposure region B12 is formed by the first exposure and the first exposure region B21 is formed by the second exposure, the orthographic projection of the half of the scale structure E1 formed in the second exposure region B12 on the base 100 is not overlapped with the orthographic projection of the half of the scale structure E2 formed in half of a sub-pixel region in the first exposure region B21 on the base 100. Therefore, after the second exposure, the scale structures (E1, E2) are not retained in the first exposure region B21. However, in the first exposure, the first shielding plate 222a shields the portion of the second mask 111b of the mask plate 111 that is used to form a half row of sub-pixels, such that a half of the scale structure E2 is retained in half of a sub-pixel region in the second normal display region AA3.

It should be noted that the first normal display region AA1 and the second normal display region AA3 shown in the above embodiments are two normal display regions arranged up and down, and the above embodiments are schematically illustrated by taking an example in which the two normal display regions arranged up and down and the first spliced display region the two normal display regions are exposed. The exposure on two normal display regions arranged left and right and the first spliced display region between therebetween is similar to the above embodiments, and details are not described herein again.

In this way, in the patterned film layer structure 100a formed based on the same mask plate in the array substrate 000, the distance between the two scale structures (E1, E2) in a group of scale patterns 100a4 in the patterned film layer structure 100a reflects the width of the first spliced display region 001b between the two adjacent normal display regions 001a. For example, the distance between the two scale structures (E1, E2) respectively disposed in two adjacent normal display regions 001a in the direction perpendicular to the length direction of the first spliced display region 001b is measured by using an electronic ruler. If the measured width of the first spliced display region 001b is too large, the positions of the second shielding plate 222b and the first shielding plate 222a can be adjusted according to the length of the scale structure E1 or the length of the scale structure E2, such that the width of the first spliced display region 001b is always in a proper range, thereby improving the display effect of the display panel formed subsequently.

In the related art, in the case that in the process of forming the film layer structure in the first spliced display region by two exposures, the two exposures are performed using the same mask of the mask plate and no mask scale is provided on the mask plate, the position of the shielding plate cannot be adjusted according to the width of the first spliced display region in the array substrate, and it is difficult to ensure that the width of the first spliced display region is always in a proper range. As a result, the width of the first spliced display region in the same patterned film layer structure in the manufactured array substrate is non-uniform, which results in a poor display effect of the display panel formed subsequently.

In the embodiments of the present disclosure, in the process of forming the film layer structure in the first spliced display region 001b, two exposures are required, and the first mask and the second mask of the mask plate are simultaneously used in the two exposures, and after the photoresist film is developed after the two exposures, only the photoresist in the first exposure regions formed based on the first mask is retained. In addition, in the process of forming the film layer structure in the normal display region 001a, two groups of mask scales at different positions in the mask plate are respectively used in the two exposures, and after the photoresist film is developed after the two exposures, only the scale structures (E1, E2) disposed in the two adjacent normal display regions 001a on two sides of the first spliced display region are retained. Therefore, in the patterned film layer structure 100a formed based on the same mask plate in the array substrate 000, the width of the first spliced display region 001b between the two adjacent normal display regions 001a can be determined based on the scale structures (E1, E2) disposed in the two adjacent normal display regions 001a, and the shielding plate can also be adjusted according to the lengths of the two scale structures (E1, E2) to keep the width of the first spliced display region 001b in a proper range all the time. In this way, in the embodiments of the present disclosure, the width of the first spliced display region 001b in each of the patterned film layer structures 100a in the array substrate 000 can be stably and reliably controlled, thereby improving the display effect of the display panel subsequently formed. Moreover, in the actual production process, the width of the first spliced display region 001b in each of the patterned film layer structures 100a can be monitored and adjusted at any time, and thus the yield of the display panel is high.

In summary: the array substrate provided in the embodiments of the present disclosure includes a base and a plurality of patterned film layer structures laminated on the base. The portion of the patterned film layer structure disposed in the first spliced display region is formed based on the first mask and the second mask of the mask plate, and the portion of the patterned film layer structure disposed in the normal display region can also be formed based on the first mask of the mask plate, and the portion of the patterned film layer structure disposed in the non-display region can also be formed based on the second mask of the mask plate. Therefore, in the process of forming the patterned film layer structure in the array substrate, there is no need to separately expose the photoresist in the first spliced display region using an additional mask plate, which effectively reduces the number of exposures and simplifies the manufacturing process of the large-size display panel manufactured based on the array substrate. Moreover, in the process of forming the film layer structure in the normal display region, two groups of mask scales at different positions in the mask plate are respectively used in the two exposures, and after the photoresist film is developed after the two exposures, only the scale structures disposed in the adjacent two normal display regions on two sides of the first spliced display region are retained. Therefore, in the patterned film layer structure formed based on the same mask plate in the array substrate, the width of the first spliced display region between the adjacent two normal display regions can be determined based on the scale structures disposed in the adjacent two normal display regions, and the light shielding plate can also be adjusted according to the lengths of the two scale structures to keep the width of the first spliced display region in a proper range all the time. In this way, in the embodiments of the present disclosure, the width of the first spliced display region in each of the patterned film layer structures in the array substrate can be stably and reliably controlled, thereby improving the display effect of the display panel subsequently formed. Moreover, in the actual production process, the width of the first spliced display region in each of the patterned film layer structures can be monitored and adjusted at any time, and thus the yield of the display panel is high.

In an example implementation, in the process of performing two exposures on the same region in the photoresist film, there is usually a certain exposure error. Therefore, in the patterned film layer structure 100a formed based on the same mask plate in the array substrate 000, the unit area of the partial pattern disposed in the first spliced display region 001b is slightly smaller than the unit area of the partial pattern disposed in the normal display region 001a. For example, in the case that the patterned film layer structure 100a includes a signal line, the width of the signal line disposed in the first spliced display region 001b is less than the width of the signal line disposed in the normal display region 001a by 0.1 to 2 μm. Thus, the area of the orthographic projection of the pixel electrode in the second sub-pixel 100a3 disposed in the first spliced display region 001b on the base 100 is smaller than or equal to the area of the orthographic projection of the pixel electrode in the first sub-pixel 100a1 disposed in the normal display region 001a on the base 100.

In the embodiments of the present disclosure, as shown in FIG. 4, in the case that a portion of the third sub-pixel 100a5 in the array substrate 000 is disposed in the normal display region 001a, and the other portion of the third sub-pixel 100a5 is disposed in the first spliced display region 001b, in the direction parallel to the length direction of the first spliced display region 001b, i.e., in the Y direction shown in FIG. 4, the width of the portion of the third sub-pixel 100a5 disposed in the first spliced display region 001b is less than or equal to the width of the portion of the third sub-pixel 100a5 disposed in the normal display region 001a. It should be noted that, in the direction parallel to the length direction of the first spliced display region 001b, the width of the portion of the third sub-pixel 100a5 disposed in the first spliced display region 001b may be equal to the width of the portion of the third sub-pixel 100a5 disposed in the normal display region 001a. However, in some example implementations, since there is usually a certain exposure error in the process of performing two exposures, the width of the portion of the third sub-pixel 100a5 disposed in the first spliced display region 001b is slightly smaller than the width of the portion of the third sub-pixel 100a5 disposed in the normal display region 001a.

In some embodiments, as shown in FIG. 1, the portion of each patterned film layer structure 100a disposed in the display region 001 further has a second spliced display region 001d, and the second spliced display region 001d is between two first spliced display regions 001b arranged in the row direction and between two first spliced display regions 001b arranged in the column direction. The plurality of sub-pixels formed of at least some of the plurality of patterned film layer structures 100a further include a plurality of fourth sub-pixels disposed in the second spliced display region 001d.

In a possible implementation, in the process of manufacturing the patterned film layer structure 100a in the array substrate 000, four exposure processes need to be performed on the second spliced display region 001d. Therefore, in the patterned film layer structure 100a formed based on the same mask plate in the array substrate 000, the unit area of the partial pattern disposed in the second spliced display region 001d is slightly smaller than the unit area of the partial pattern disposed in the first spliced display region 001b. Thus, the area of the orthographic projection of the pixel electrode in the fourth sub-pixel disposed in the second spliced display region 001d on the base 100 is smaller than or equal to the area of the orthographic projection of the pixel electrode in the second sub-pixel 100a3 disposed in the first spliced display region 001b on the base 100.

In the embodiments of the present disclosure, the orthographic projections of at least portions of the two scale structures (E1, E2) on the base 100 are respectively within the orthographic projections of two sub-pixels on the base 100, and the two sub-pixels are arranged in a row direction or a column direction of the plurality of sub-pixels. For example, as shown in FIG. 4, the orthographic projections of at least portions of the two scale structures (E1, E2) on the base 100 are respectively within the orthographic projections of two adjacent third sub-pixels 100*a*5 on the base 100. The area of each of the orthographic projections of the scale structure E1 and the scale structure E2 on the base 100 is smaller than the area of the orthographic projection of the corresponding third sub-pixel 100*a*5 on the base 100. In this way, the scale structures (E1, E2) do not affect the display effect of the display panel integrated with the array substrate 000. It should be noted that FIG. 4 in the above embodiments is schematically illustrated by taking two third sub-pixels 100*a*5 arranged in the column direction as an example.

Figure 9:
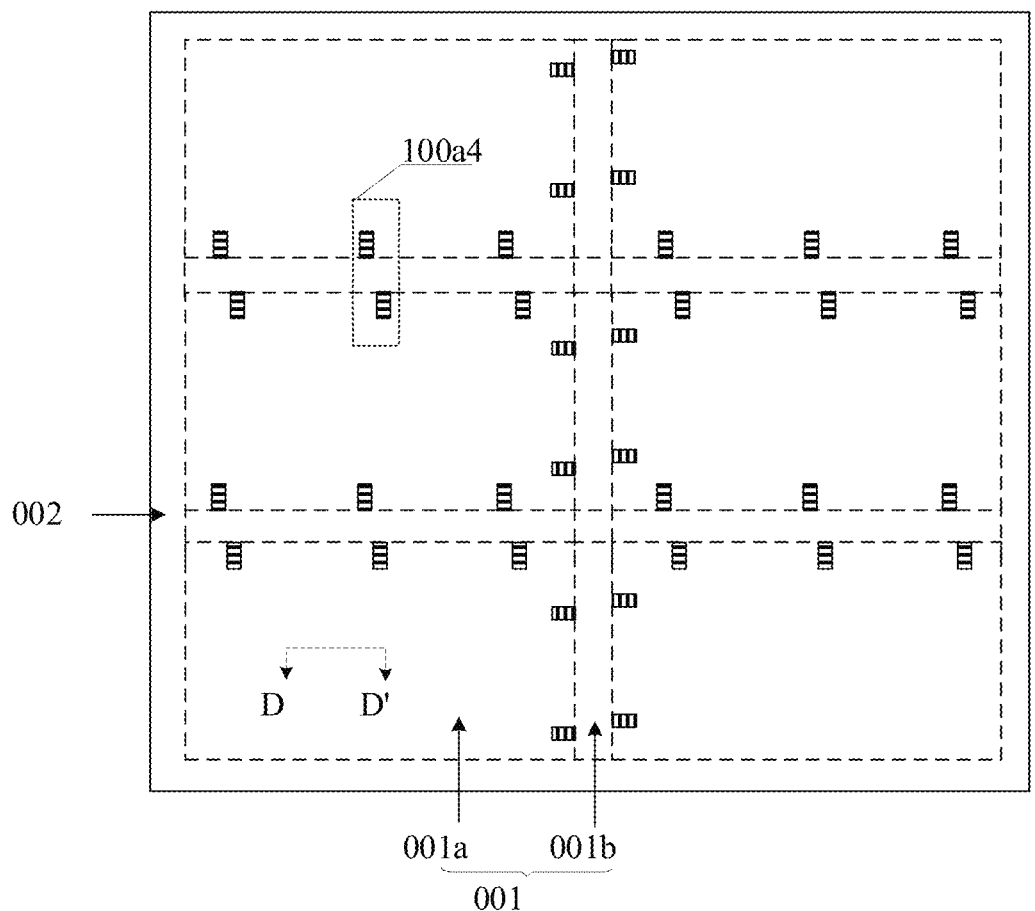
FIG. 9 is a top view of another array substrate according to some embodiments of the present disclosure.
Figure 10:
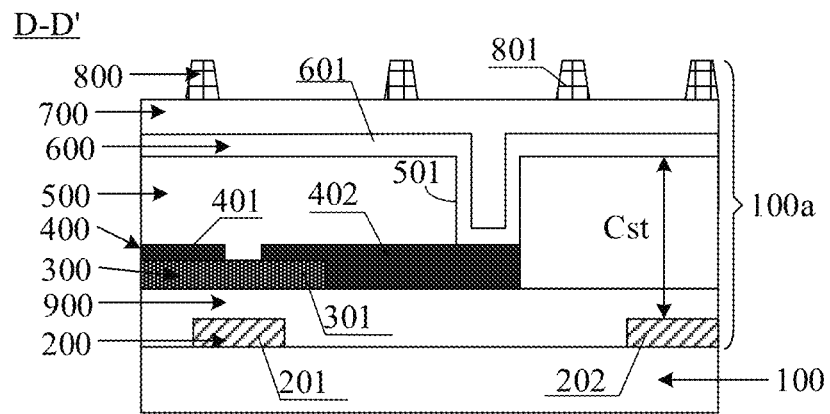
FIG. 10 is a schematic diagram of a film layer structure at position D-D' of the array substrate shown in FIG. 9.

In the present disclosure, referring to FIG. 9 and FIG. 10. FIG. 9 is a top view of another array substrate according to some embodiments of the present disclosure, and FIG. 10 is a schematic diagram of a film layer structure at position D-D' of the array substrate shown in FIG. 9. The array substrate 000 is provided with a plurality of groups of scale patterns 100*a*4 arranged in the direction parallel to the length directions of the first spliced display regions 001*b*, and the orthographic projections of the plurality of groups of scale patterns 100*a*4 on the base 100 are overlapped with each other.

In this way, in the process of forming the film layer structure in the first spliced display region 001*b*, according to the average value of the distances between the two scale structures (E1, E2) in the plurality of groups of scale patterns 100*a*4, it can be ensured that the first spliced display region 001*b* has a relatively uniform width at various positions in the length direction of the first spliced display region 001*b*. In addition, according to the average value of the distances between the plurality of scale structures E1 and the first spliced display regions 001*b*, it is ensured that the first shielding plate 000*a* can be accurately adjusted. Similarly, according to the average value of the distances between the plurality of scale structures E2 and the first spliced display regions 001*b*, it is ensured that the second shielding plate 000*b* can be accurately adjusted.

In the embodiments of the present disclosure, a group of scale patterns 100*a*4 may have have various structures. For clearer descriptions, the structure of a group of scale patterns 100*a*4 is schematically illustrated by taking the film layer structure closest to the base 100 in the plurality of patterned film layer structures 100*a* as an example in the embodiments of the present disclosure. The film layer structure closest to the base 100 in the plurality of patterned film layer structures 100*a* in the array substrate 000 is the first conductive layer 200, and a group of scale patterns 100*a*4 in the first conductive layer 200 has the following two possible structures.

Figure 11:
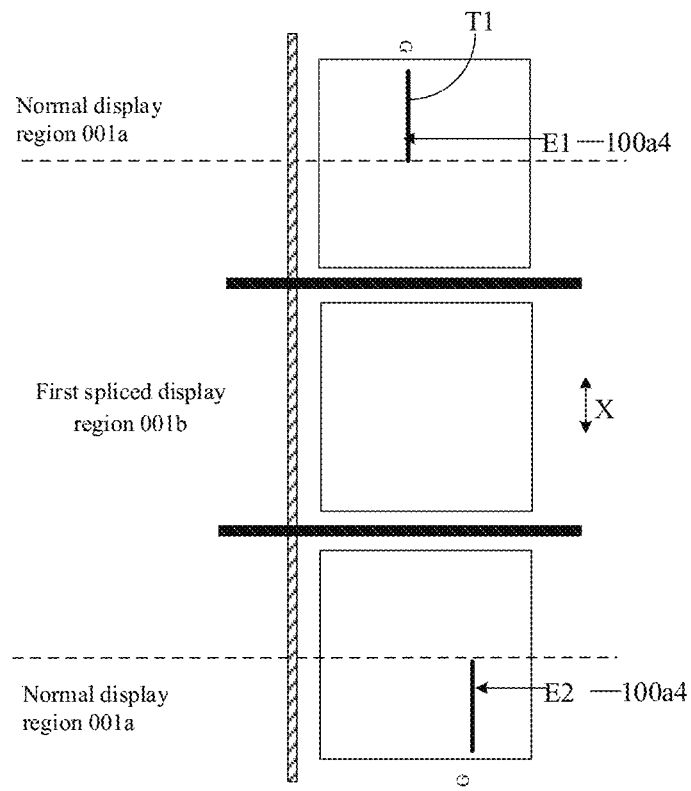
FIG. 11 is a schematic structural diagram of a scale pattern in a first conductive layer according to some embodiments of the present disclosure.

For the first structure, please refer to FIG. 11, and FIG. 11 is a schematic structural diagram of a scale pattern in the first conductive layer according to some embodiments of the present disclosure. The scale structures (E1, E2) in the first conductive layer 200 both include a first strip-shaped structure T1, and the length directions of the two first strip-shaped structures T1 in the group of scale patterns 100*a*4 are parallel to each other. In this way, in the direction perpendicular to the length direction of the first spliced display region 001*b*, i.e., in the X direction shown in FIG. 11, the distance between the two scale structures (E1, E2) is measured using an electronic ruler, thereby acquiring the width of the first spliced display region 001*b* between the two scale structures (E1, E2).

Figure 12:
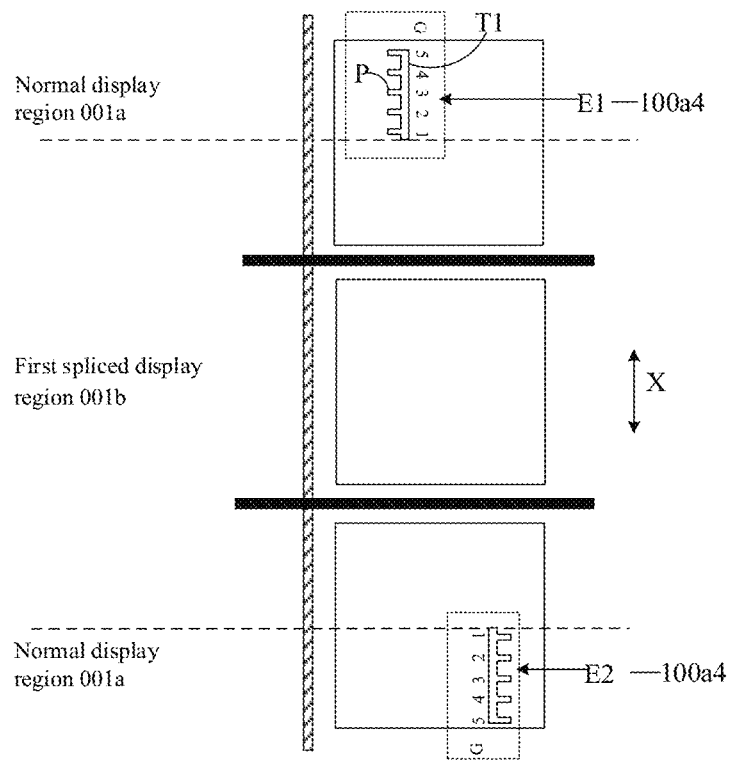
FIG. 12 is a schematic structural diagram of another scale pattern in a first conductive layer according to some embodiments of the present disclosure.

For the second structure, please refer to FIG. 12, and FIG. 12 is a schematic structural diagram of another scale pattern in the first conductive layer according to some embodiments of the present disclosure. In addition to the first strip-shaped structure T1, the scale structures (E1, E2) in the first conductive layer 200 further both include at least one protruding structure P connected to the first strip-shaped structure T1. Each protruding structure P has a corresponding number identifier, and the lengths of the two scale structures (E1, E2) and the width of the first spliced display region 001*b* between the two scale structures (E1, E2) in the direction perpendicular to the length direction of the first spliced display region 001*b* (i.e., the X direction) can be intuitively seen through the number identifiers.

It should be noted that the mask scales 111*c* on the mask plate 111 and the scale patterns 100*a*4 in the array substrate 000 are arranged in correspondence. For the correspondence, please refer to the process of forming a group of scale patterns 100*a*4 in the array substrate 000 in the above embodiments. As shown in FIG. 6 and FIG. 7, the closer a portion of the mask plate 111 is to the first spliced display region 001*b*, the smaller the numerical value of the number identifier on the portion of the mask plate 111 is. For example, for the group of mask scales 111*c* at position D, the number identifiers gradually decrease from 5 to −4 when the portion of the mask plate 111 gets closer to the first spliced display region 001*b*.

The number of the protruding structures P on the first strip-shaped structure T1 is within a preset number range. The number of the protruding structures P in each of a group of scale patterns 100*a*4 ranges from 1 to 8. The more the protruding structures P on the first strip-shaped structure T1, the smaller the width of the first spliced display region 001*b*, and the smaller the protruding structures P on the first strip-shaped structure T1, the larger the width of the first spliced display region 001*b*.

Figure 13:
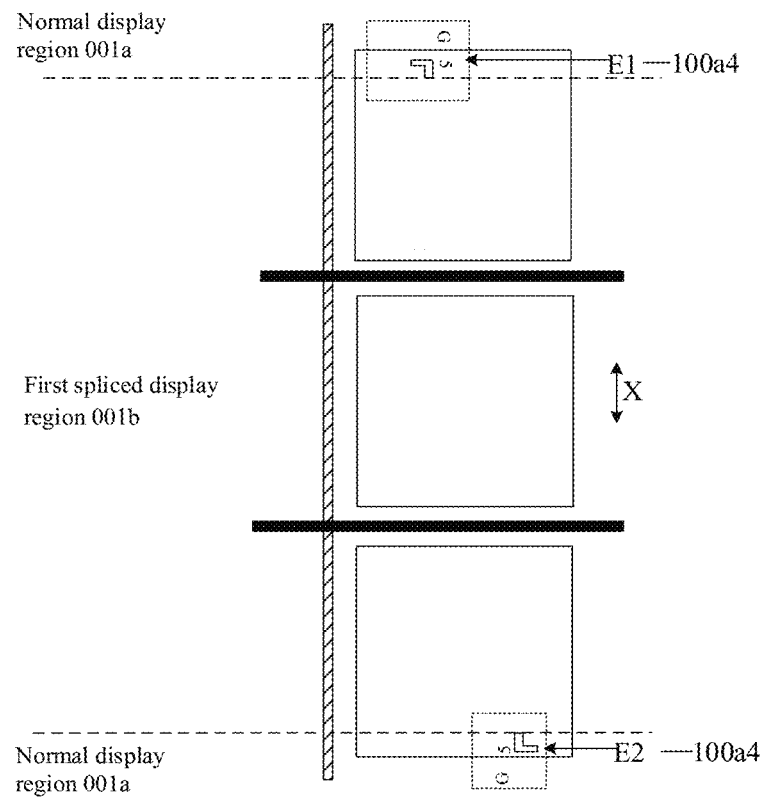
FIG. 13 is a schematic diagram of a scale structure when the number of the protruding structure P is 1 according to some embodiments of the present disclosure.
Figure 14:
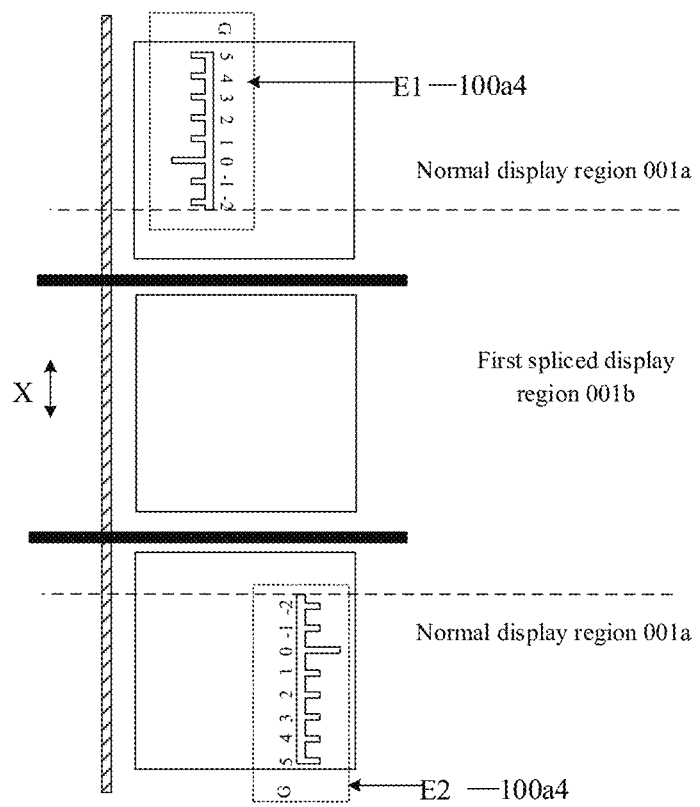
FIG. 14 is a schematic diagram of a scale structure when the number of the protruding structures P is 8 according to some embodiments of the present disclosure.

In the embodiments of the present disclosure, the scale structures (E1, E2) both have a plurality of protruding structures P, and the plurality of protruding structures P and the first strip-shaped structure T1 form a comb-shaped structure. The plurality of protruding structures P are uniformly distributed in the length direction of the first strip-shaped structure T1. In this case, for a clearer view of the preset number range of the protruding structures P on the scale structures (E1, E2), please refer to FIG. 13 and FIG. 14. FIG. 13 is a schematic diagram of a scale structure when the number of the protruding structure P is 1 according to some embodiments of the present disclosure, and FIG. 14 is a schematic diagram of a scale structure when the number of the protruding structures P is 8 according to some embodiments of the present disclosure. When the number of the protruding structures P is 1, the reading on the scale structure E1 and the scale structure E2 is 5; and when the number of the protruding structures P is 8, the reading on the scale structure E1 and the scale structure E2 is −2. It should be noted that the number of the protruding structures P on the scale structure E1 in the group of scale patterns 100*a*4 ranges from 1 to 8, and the number of the protruding structures P on the scale structure E2 in the group of scale patterns 100*a*4 ranges from 1 to 8. The scale structure E1 and the scale structure E2 shown in FIG. 13 both have only one protruding structure P, and the width of the first spliced display region 001*b* is the largest; and the scale structure E1 and the scale structure E2 shown in FIG. 14 both have 8 protruding structures P, and the width of the first spliced display region 001b is the smallest. For example, the width of the first spliced display region 001b in the first conductive layer 200 ranges from 1.4 mm to 3.0 mm. In this way, in the process of forming the film layer structure in the first spliced display region 001b in the first conductive layer 200, if the number of the protruding structures P exceeds the preset number range, it indicates that the width of the first spliced display region 001b is too large or too small, and the position of the corresponding mask plate can be adjusted according to the number of the protruding structures P on the first strip-shaped structure T1.

Figure 15:
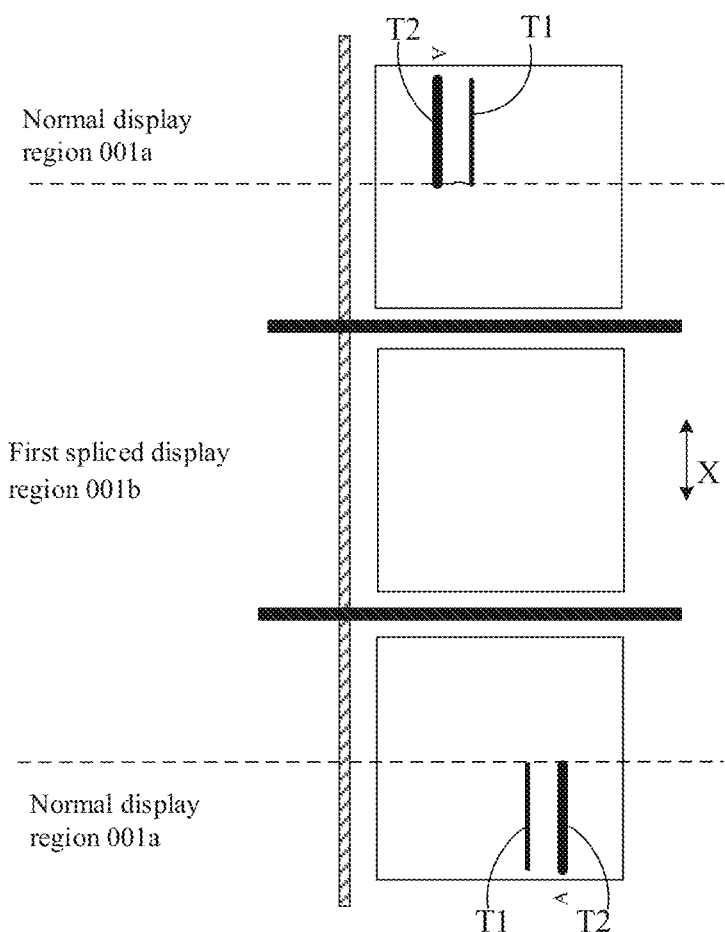
FIG. 15 is a schematic diagram of a scale pattern in a first conductive layer and a scale pattern in a film layer structure other than the first conductive layer according to some embodiments of the present disclosure.

In the embodiments of the present disclosure, referring to FIG. 15. FIG. 15 is a schematic diagram of a scale pattern in a first conductive layer and a scale pattern in a film layer structure other than the first conductive layer according to some embodiments of the present disclosure. The scale structures in the film layer structures other than the first conductive layer 200 in the plurality of patterned film layer structures 100a all include a second strip-shaped structure T2. The length direction of the second strip-shaped structure T2 is parallel to the length direction of the first strip-shaped structure T1. The width of the first spliced display region 001b in the film layer structure other than the first conductive layer 200 can be controlled by providing the second strip-shaped structure T2. It should be noted that, in other possible implementations, the scale pattern 100a4 in each of the film layer structures 100a other than the first conductive layer 200 may also be in the same structure as the second scale pattern 100a4 shown in the second structure in the first conductive layer 200, which is not limited in this disclosure. It should also be noted that FIG. 15 merely schematically illustrates the first strip-shaped structure T1 and a second strip-shaped structure T2 in another film layer structure.

Figure 16:
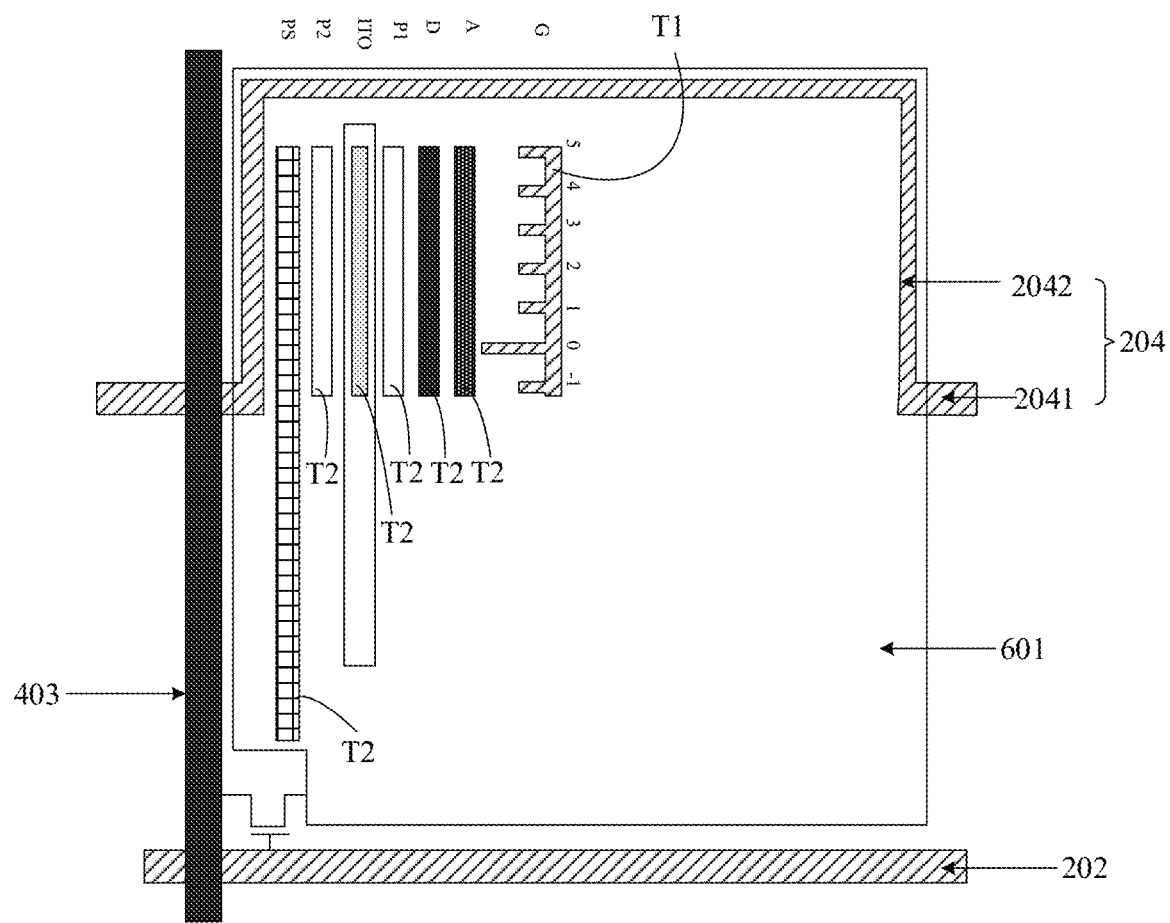
FIG. 16 is a top view of a sub-pixel in an array substrate according to some embodiments of the present disclosure.

In the present disclosure, referring to FIG. 16. FIG. 16 is a top view of a sub-pixel in an array substrate according to some embodiments of the present disclosure. The film layer structures other than the first conductive layer 200 in the plurality of patterned film layer structures 100a all include second strip-shaped structures T2 corresponding to the same first strip-shaped structure T1. The orthographic projection of at least a portion of the same first strip-shaped structure T1 on the base 100 and the orthographic projection of at least a portion of each corresponding second strip-shaped structure T2 on the base 100 are within the orthographic projection of the same sub-pixel on the base 100, and the orthographic projection of the first strip-shaped structure T1 on the base 100 is not overlapped with the orthographic projection of each corresponding second strip-shaped structure T2 on the base 100. After the two scale structures (E1, E2) are formed on two sides of the first spliced display region 001b in the first conductive layer 200, the lengths of the two first strip-shaped structures T1 in the first conductive layer 200 can be determined. In this way, when the subsequent patterned film layer structure 100a is formed, the length of the second strip-shaped structure T2 can be determined by referring to the length of the corresponding first strip-shaped structure T1, and further the width of the first spliced display region 001b in the subsequent patterned film layer structure 100a can be controlled based on the second strip-shaped structures T2 disposed on two sides of the first spliced display region 001b in the subsequent patterned film layer structure 100a. It should be noted that, in the subsequent patterned film layer structure 100a, the area of the orthographic projection of the second strip-shaped structure T2 corresponding to the first strip-shaped structure T1 on the base 100 is smaller than the area of the orthographic projection of one sub-pixel on the base 100. In this way, the second strip-shaped structure T2 in the subsequent patterned film layer structure 100a does not affect the display effect of the display panel integrated with the array substrate 000.

In other possible implementations, the plurality of second strip-shaped structures T2 in different patterned film layer structures 100a may also be in one-to-one correspondence with the plurality of first strip-shaped structures T1 in the first conductive layer 200, and the orthographic projection of each first strip-shaped structure T1 on the base 100 and the orthographic projection of at least a portion of the corresponding second strip-shaped structure T2 on the base 100 are within the orthographic projection of the same sub-pixel on the base 100, and the orthographic projections of different first strip-shaped structures T1 on the base 100 are within the orthographic projections of different sub-pixels on the base 100. That is, only one first strip-shaped structure T1 and one corresponding second strip-shaped structure T2 are disposed in one sub-pixel.

It should be noted that the following embodiments are described by taking an example in which the film layer structures other than the first conductive layer 200 in the plurality of patterned film layer structures 100a all have second strip-shaped structures T2 corresponding to the same first strip-shaped structure T1.

In the embodiments of the present disclosure, as shown in FIG. 9 and FIG. 15, the film layer structures other than the first conductive layer 200 in the plurality of patterned film layer structures 100a in the array substrate 000 each include two second strip-shaped structures T2 (not labeled in FIG. 9) disposed in the region of a group of scale patterns 100a4. Moreover, as shown in FIG. 16, the orthographic projections of the second strip-shaped structures T2 in different patterned film layer structures 100a on the base 100 are not overlapped. In this way, the width of each first spliced display region 100b in each patterned film layer structure 100a can be conveniently checked subsequently.

For example, as shown in FIG. 10, in addition to the first conductive layer 200, the plurality of patterned film layer structures 100a include six other film layer structures, which are respectively: an active layer pattern 300, a second conductive layer 400, a first insulating layer 500, a pixel electrode layer 600, a second insulating layer 700 and a support pattern 800. The active layer pattern 300, the second conductive layer 400, the first insulating layer 500, the pixel electrode layer 600, the second insulating layer 700 and the support pattern 800 are sequentially laminated in a direction perpendicular to and away from the base 100. In addition to the plurality of patterned film layer structures 100a, the array substrate 000 further includes a film layer structure disposed in an entire layer. For example, the array substrate 000 further includes a gate insulating layer 900 disposed in an entire layer between the active layer pattern 300 and the first conductive layer 200. The patterned film layer structure in the array substrate 000 is a film layer structure formed based on a mask plate through a patterning process, and the film layer structure disposed in the entire layer in the array substrate 000 is a film layer structure formed without a patterning process. It should be noted that the first insulating layer 500 and the second insulating layer 700 in the array substrate 000 are both passivation layers or planarization layers. In the case that the first insulating layer 500 and the second insulating layer 700 are planarization layers, the first insulating layer 500 and the second insulating layer 700 not only have an insulating function, but also have a planarization function.

In this case, as shown in FIG. 16, the same sub-pixel is simultaneously provided with; one first strip-shaped structure T1 in the first conductive layer 200, one second strip-shaped structure T2 corresponding to the first strip-shaped structure T1 in the active layer pattern 300, one second strip-shaped structure T2 corresponding to the first strip-shaped structure T1 in the second conductive layer 400, one second strip-shaped structure T2 corresponding to the first strip-shaped structure T1 in the first insulating layer 500, one second strip-shaped structure T2 corresponding to the first strip-shaped structure T1 in the pixel electrode layer 600, one second strip-shaped structure T2 corresponding to the first strip-shaped structure T1 in the second insulating layer 700, and one second strip-shaped structure T2 corresponding to the first strip-shaped structure T1 in the support pattern 800. The active layer pattern 300, the second conductive layer 400, the pixel electrode layer 600 and the support pattern 800 in the array substrate 000 are generally provided with protruding pattern structures arranged periodically. Therefore, the second strip-shaped structures T2 in the active layer pattern 300, the second conductive layer 400, the pixel electrode layer 600 and the support pattern 800 are strip-shaped protrusions. In addition, the first insulating layer 500 and the second insulating layer 700 in the array substrate 000 mainly play an insulating function, and are generally only provided with pattern structures in the shape of a groove or hole. Therefore, the second strip-shaped structures T2 in the first insulating layer 500 and the second insulating layer 700 are strip-shaped grooves.

In the embodiments of the present disclosure, the length of the second strip-shaped structure T2 in the support pattern 800 is greater than the length of the first strip-shaped structure T1, and in the direction perpendicular to the length direction of the first spliced display region 001b between the two adjacent normal display regions 001a, the distance between the two second strip-shaped structures T2 in a group of scale patterns 100a4 is less than the width of one sub-pixel.

Figure 17:
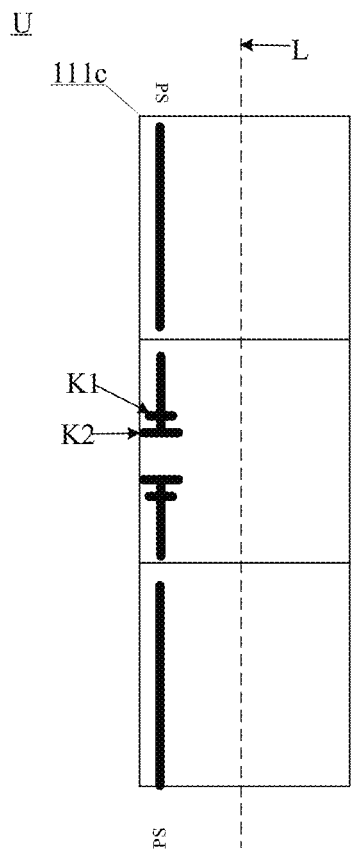
FIG. 17 is a schematic diagram of another mask scale at position U shown in FIG. 5.
Figure 18:
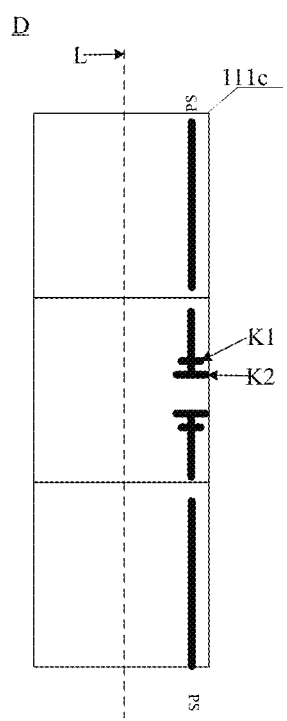
FIG. 18 is a schematic diagram of another mask scale at position D shown in FIG. 5.

Referring to FIG. 17 and FIG. 18. FIG. 17 is a schematic diagram of another mask scale at position U shown in FIG. 5, and FIG. 18 is a schematic diagram of another mask scale at position D shown in FIG. 5. Assuming that the mask plate shown in FIG. 5 is a mask used to manufacture the support pattern 800 in the array substrate 000, then this mask plate can be used to form the support pattern 800. The process of forming the support pattern 800 is the same as the method in the foregoing embodiments, and details are not described herein again. In addition, for the positional relationship between the mask scale 111c at position U and the mask scale 111c at position D, please refer to the corresponding content in the foregoing embodiments, which is not described herein again. The two second strip-shaped structures T2 on two sides of the first spliced display region 001b in the support pattern 800 can be acquired through the processes described in the foregoing embodiments, that is, the width of the first spliced display region 001b in the support pattern 800 can be controlled.

Figure 19:
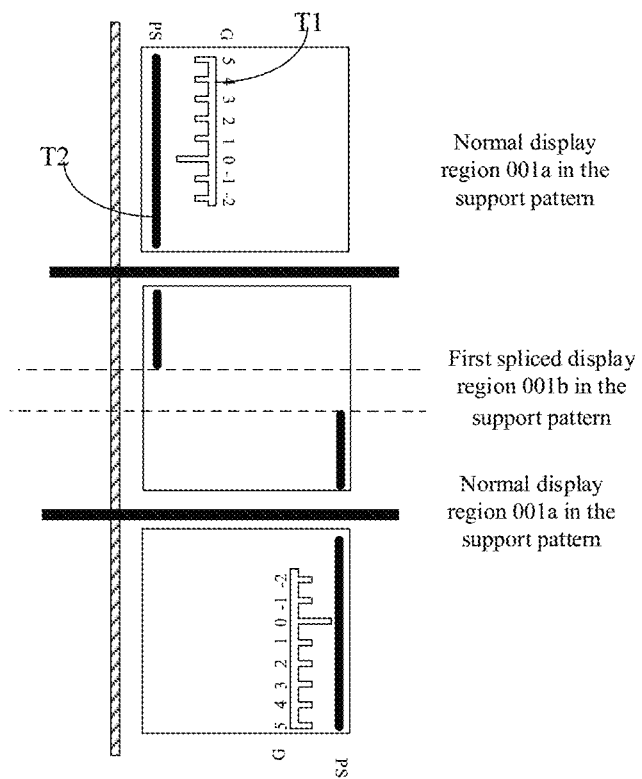
FIG. 19 is a schematic diagram of a second strip-shaped structure in a support pattern according to some embodiments of the present disclosure.
Figure 20:
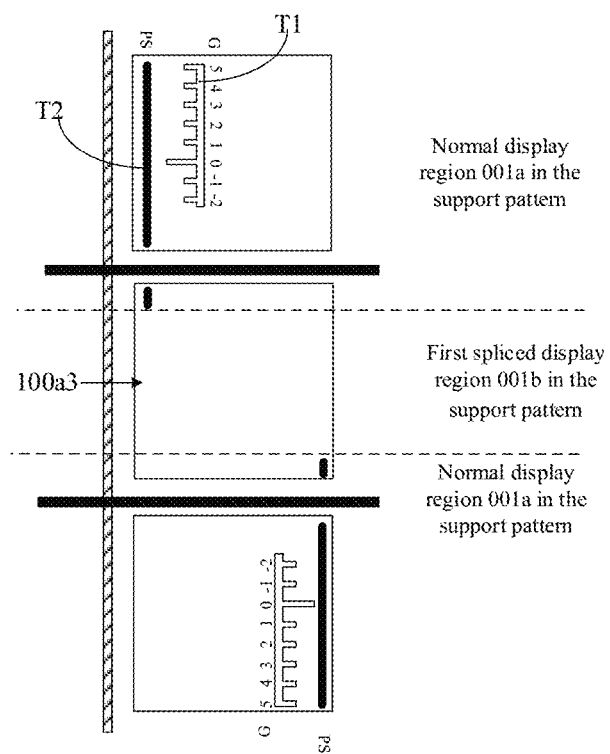
FIG. 20 is a schematic diagram of another second strip-shaped structure in a support pattern according to some embodiments of the present disclosure.

For example, referring to FIG. 19 and FIG. 20. FIG. 19 is a schematic diagram of a second strip-shaped structure in a support pattern according to some embodiments of the present disclosure, and FIG. 20 is a schematic diagram of another second strip-shaped structure in a support pattern according to some embodiments of the present disclosure. In the support pattern 800, the orthographic projection of a portion of the second strip-shaped structure T2 on the base 100 and the orthographic projection of the corresponding first strip-shaped structure T1 on the base 100 are within the orthographic projection of the same sub-pixel on the base 100. Here, the sub-pixel is the third sub-pixel 100a5. The orthographic projection of the other portion of the second strip-shaped structure T2 on the base 100 and the orthographic projection of the corresponding first strip-shaped structure T1 on the base 100 are within the orthographic projections of different sub-pixels on the base 100, and the orthographic projections of the other portions of the two second strip-shaped structures T2 in a group of the scale patterns 100a4 on the base 100 are within the orthographic projection of the same sub-pixel on the base 100. Here, the sub-pixel is the second sub-pixel 100a3. In this way, the other portions of two second strip-shaped structures T2 in a group of scale patterns 100a4 are always disposed in the second sub-pixel 100a3, and thus the first spliced display region 001b in the support pattern 800 is at the central position of the second sub-pixel 100a3.

It should be noted that, in the process of forming the support pattern 800 in the array substrate 000, it is necessary to form an entire layer of resin material film having better photosensitivity on the base, and then perform processes such as exposure and developing on the resin material film. Since the support pattern 800 is made of a resin material having better photosensitivity, the smaller the width of the second exposure region of the support pattern 800 is, the less the pattern of the portion of the support pattern 800 in the first spliced display region 001b is likely to be interfered by the second exposure. Therefore, the first spliced display region 001b in the support pattern 800 needs to be controlled to be in the region where one row of sub-pixels are disposed, and the width of the first spliced display region 001b in the support pattern 800 is not greater than the width of a single sub-pixel. It should be noted that the lengths of the two second strip-shaped structures T2 shown in FIG. 19 are relatively large, and in this case, the width of the first spliced display region 001b in the support pattern 800 is the smallest; and the lengths of the two second strip-shaped structures T2 shown in FIG. 20 are relatively small, and in this case, the width of the first spliced display region 001b in the support pattern 800 is the largest. For example, the width of the first display region 001b in the support pattern 800 ranges from 0.2 mm to 1.0 mm. In this way, the patterns of the portions of the support pattern 800 in the normal display region 001a and the first spliced display region 001b are relatively uniform, and the display effect of the display panel subsequently formed is better.

It should be noted that, as shown in FIG. 17 and FIG. 18, a group of mask scales 111c in the mask plate 111 is further provided with a first vertical identifier K1 and a second vertical identifier K2, and the distance between the first vertical identifier K1 and the second vertical identifier K2 is the same in the group of mask scales 111c. The first vertical identifier K1 and the second vertical identifier K2 are used to monitor the position of the shielding plate in the manufacturing process of the support pattern 800.

For example, when the shielding plate deviates from the normal position, the width of the first spliced display region 001b in the support pattern 800 exceeds the normal range. The normal position of the shielding plate refers to the position of the shielding plate when the width of the first spliced display region 001b in the formed support pattern 800 is within the normal range. When the shielding plate deviates from the normal position, after the support pattern 800 is formed, the two second strip-shaped structures T2 on two sides of the first spliced display region 001b in the support pattern 800 include structures corresponding to the first vertical identifier K1 or the second vertical identifier K2. In this case, the position of the shielding plate can be adjusted based on the structures corresponding to the first vertical identifier K1 or the second vertical identifier K2 included in the two second strip-shaped structures T2. For example, in the case that the two second strip-shaped structures T2 on two sides of the first spliced display region 001*b* in the support pattern 800 include structures corresponding to the first vertical identifier K1, the shielding plate is translated by 0.05 mm toward the normal position; and in the case that the two second strip-shaped structures T2 on two sides of the first spliced display region 001*b* in the support pattern 800 include structures corresponding to the first vertical identifier K1 and the second vertical identifier K2, the shielding plate is translated by 0.1 mm toward the normal position. In this way, after the position of the shielding plate is adjusted in the mask plate 111, the width of the first spliced display region 001*b* in the formed support pattern 800 is within the normal range.

In the embodiments of the present disclosure, a group of scale patterns 100*a*4 is further provided with two marker structures in one-to-one correspondence with the two scale structures (E1, E2), and the scale structures (E1, E2) are closer to the first spliced display region 001*b* than the corresponding marker structures are. The marker structure is used for distinguishing different patterned film layer structures 100*a*, and therefore, different patterned film layer structures 100*a* correspond to different marker structures. For example, as shown in FIG. 4. FIG. 8. FIG. 11. FIG. 12. FIG. 13. FIG. 14 and FIG. 16, the marker structure of the first conductive layer 200 is a letter "G": as shown in FIG. 16, the marker structure of the active layer pattern 300 is a letter "A": the marker structure of the second conductive layer 400 is a letter "D": the marker structure of the first insulating layer 500 is letter a "P1": the marker structure of the pixel electrode layer 600 is a letter "ITO": the marker structure of the second insulating layer 500 is a letter "P2"; and the marker structure of the support pattern 800 is a letter "PS".

It should be noted that there is a corresponding mask plate 111 for each patterned film layer structure 100*a*, and each group of mask scales 111*c* in each mask plate 111 also has the same letter as the marker structure in the patterned film layer structure 100*a*. Here, a group of mask scales 111*c* has two letters same as the marker structure in the patterned film layer structure 100*a*.

In this case, if the marker structure is also formed in the first spliced display region 100*b* in the patterned film layer structure 100*a* acquired through the processes described in the foregoing embodiments, it indicates that the mask plate 111 has shifted a lot, and the process of forming the patterned film layer structure 100*a* needs to be checked, so as to adjust the position of the mask plate 111.

It should also be noted that, in order to avoid other abnormalities, fixed-point monitoring needs to be performed for each patterned film layer structure 100*a*. As shown in FIG. 9, after a certain patterned film layer structure 100*a* is acquired through the processes described in the foregoing embodiments, the position of each group of scale patterns 100*a*4 shown in FIG. 9 is photographed, and it is checked whether the first spliced display region 100*b* in the patterned film layer structure 100*a* is abnormal. For example, in the case that the first shielding plate 222*a* and the second shielding plate 222*b* are overlapped, a normal patterned film layer structure 100*a* cannot be formed in the first spliced display region 100*b*, that is, there is an entire layer of photoresist in the first spliced display region 100*b*.

In the embodiments of the present disclosure, as shown in FIG. 10, in addition to the scale structures (E1, E2) and the marker structure (G), the first conductive layer 200 further includes a gate electrode 201 of the thin film transistor in the sub-pixel and a gate line 202 electrically connected to the gate electrode 201.

In addition to the second strip-shaped structure T2 and the marker structure (A), the active layer pattern 300 further includes an active layer 301 of the thin film transistor in the sub-pixel. The orthographic projection of the active layer 301 of the thin film transistor on the base 100 is overlapped with the orthographic projection of the gate electrode 201 of the thin film transistor on the base 100, and the active layer 301 and the gate electrode 201 are insulated by the gate insulating layer 900.

In addition to the second strip-shaped structure T2 and the marker structure (D), the second conductive layer 400 further includes a first electrode 401 and a second electrode 402 of the thin film transistor in the sub-pixel, and a data line 403 electrically connected to the first electrode 401.

In addition to the second strip-shaped structure T2 and the marker structure (P1), the first insulating layer 500 is further provided with a connection via 501.

In addition to the second strip-shaped structure T2 and the marker structure (ITO), the pixel electrode layer 600 further includes a pixel electrode 601 in the sub-pixel. The pixel electrode 601 is electrically connected to the second electrode 403 of the thin film transistor through the connection via 501.

In addition to the second strip-shaped structure T2 and the marker structure (P2), the second insulating layer 700 is further provided with a slot disposed in the non-display region 002. The slot is used for exposing a bonding region in the non-display region 002, such that a driving component is bonded to the bonding region of the array substrate 000 through the slot.

In addition to the second strip-shaped structure T2 and the marker structure (PS), the support pattern 800 further includes a plurality of support pillars 801 arranged in an array.

In the present disclosure, a plurality of gate lines 202 and a plurality of data lines 403 are provided in the array substrate 000, the plurality of gate lines 202 are arranged in parallel, the plurality of data lines 403 are arranged in parallel, and the length direction of the gate line 202 is perpendicular to the length direction of the data line 403. In this way, each adjacent two gate lines 202 and each adjacent two data lines 403 enclose to form a sub-pixel region, and one sub-pixel region is provided with one sub-pixel.

Figure 21:
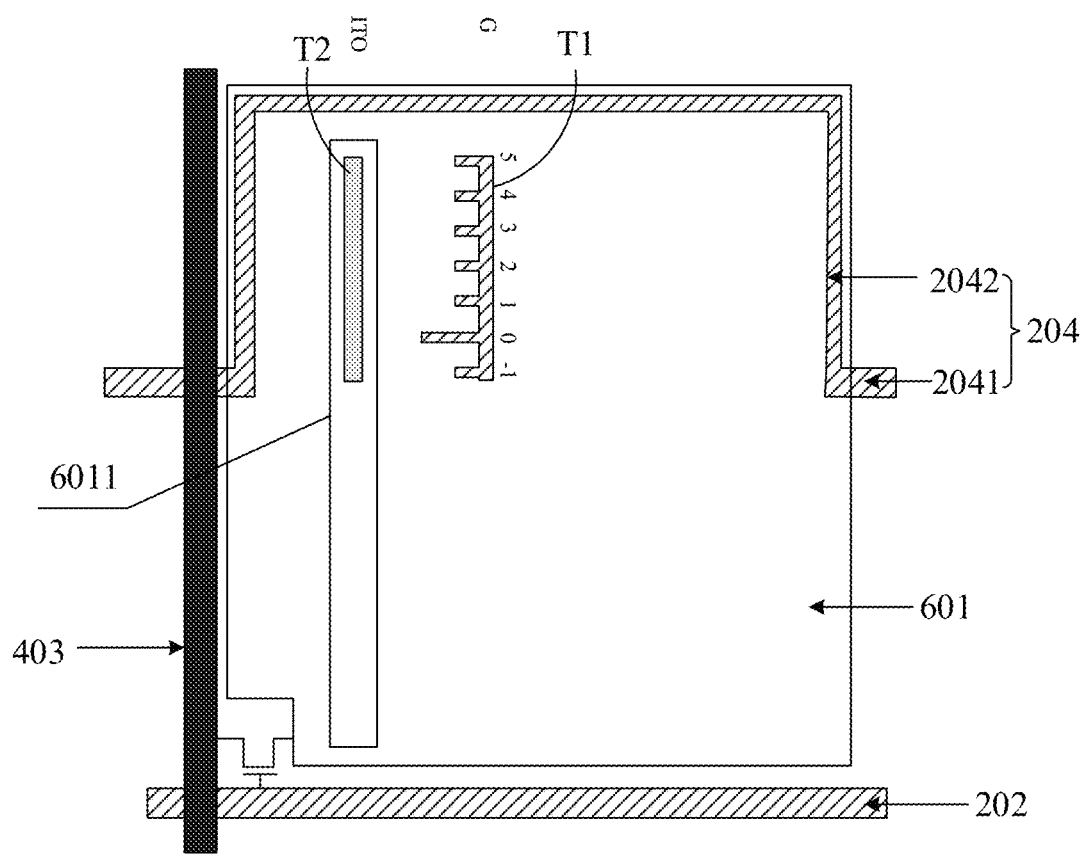
FIG. 21 is a schematic structural diagram of a sub-pixel including a second strip-shaped structure in a pixel electrode layer according to some embodiments of the present disclosure.

In the embodiments of the present disclosure, as shown in FIG. 21. FIG. 21 is a schematic structural diagram of a sub-pixel including the second strip-shaped structure in the pixel electrode layer according to some embodiments of the present disclosure. A pixel electrode 601 of which the orthographic projection on the base 100 is overlapped with the orthographic projection of the second strip-shaped structure T2 in the pixel electrode layer 600 on the base is provided with a hollow structure 6011, and the orthographic projection of the second strip-shaped structure T2 in the pixel electrode layer 600 on the base 100 is within the orthographic projection of the hollow structure 6011 on the base 100. Since the pixel electrode 601 in the sub-pixel is generally block-shaped, the horizontal distance between the pixel electrode 601 and the gate line 202 and the horizontal distance between the pixel electrode 601 and the data line 403 are smaller. Therefore, in order to normally arrange the second strip-shaped structure T2 of the pixel electrode layer 600 in the sub-pixel region, the second strip-shaped structure T2 is disposed in the hollow structure 6011. In this way, the pixel electrode 601 arranged in the sub-pixel region does not affect the position distribution of the second strip-shaped structure T2, such that the portion of the sub-pixel provided with the second strip-shaped structure T2 can work normally, and the display panel integrated with the array substrate 000 has a better display effect.

In the embodiments of the present disclosure, as shown in FIG. 16 and FIG. 21, the first conductive layer 200 further includes an auxiliary signal line 204. There is an overlapping region between the orthographic projection of the auxiliary signal line 204 on the base 100 and the orthographic projection of the pixel electrode 601 in the sub-pixel on the base 100, and the orthographic projection of the auxiliary signal line 204 on the base 100 is not overlapped with the orthographic projection of the first strip-shaped structure T1 on the base 100. In this way, the first strip-shaped structure T1 is not electrically connected to the gate line 202 or the auxiliary signal line 204 in the first conductive layer 200, and the display panel acquired subsequently has no display defect. The overlapping portion of the auxiliary signal line 204 and the pixel electrode 601 forms a storage capacitor Cst, and the pixel voltage applied to the pixel electrode 601 can be maintained by the storage capacitor Cst, such that the pixel voltage for maintaining the pixel electrode 102 does not change.

For example, the auxiliary signal line 204 includes an auxiliary signal line body 2041 and a bending wire 2042 electrically connected to the auxiliary signal line body 2041. At least a portion of the first strip-shaped structure T1 is disposed in a region enclosed by the bending wire 2042. In this way, it can be ensured that the orthographic projection of the first strip-shaped structure T1 on the base 101 is not overlapped with the orthographic projection of the auxiliary signal line 204 on the base. The length direction of the auxiliary signal line body 2041 is parallel to the length direction of the gate line 202: the bending wire 2042 consists of two first portions extending along the length direction of the data line 403 and a second portion disposed between the two first portions, and the length direction of the second portion of the bending wire 2042 is parallel to the length direction of the gate line 202. It should be noted that in the embodiments of the present disclosure, the region enclosed by the bending wire 2042 is not a closed region, but is an open region.

In summary: the array substrate provided in the embodiments of the present disclosure includes a base and a plurality of patterned film layer structures laminated on the base. The portion of the patterned film layer structure disposed in the first spliced display region is formed based on the first mask and the second mask of the mask plate, and the portion of the patterned film layer structure disposed in the normal display region can also be formed based on the first mask of the mask plate, and the portion of the patterned film layer structure disposed in the non-display region can also be formed based on the second mask of the mask plate. Therefore, in the process of forming the patterned film layer structure in the array substrate, there is no need to separately expose the photoresist in the first spliced display region using an additional mask plate, which effectively reduces the number of exposures and simplifies the manufacturing process of the large-size display panel manufactured based on the array substrate. Moreover, in the process of forming the film layer structure in the normal display region, two groups of mask scales at different positions in the mask plate are respectively used in the two exposures, and after the photoresist film is developed after the two exposures, only the scale structures disposed in the adjacent two normal display regions on two sides of the first spliced display region are retained. Therefore, in the patterned film layer structure formed based on the same mask plate in the array substrate, the width of the first spliced display region between the adjacent two normal display regions can be determined based on the scale structures disposed in the adjacent two normal display regions, and the light shielding plate can also be adjusted according to the lengths of the two scale structures to keep the width of the first spliced display region in a proper range all the time. In this way, in the embodiments of the present disclosure, the width of the first spliced display region in each of the patterned film layer structures in the array substrate can be stably and reliably controlled, thereby improving the display effect of the display panel subsequently formed. Moreover, in the actual production process, the width of the first spliced display region in each of the patterned film layer structures can be monitored and adjusted at any time, and thus the yield of the display panel is high.

The embodiments of the present disclosure further provide a liquid crystal panel. The liquid crystal panel is integrated in any large-size display device having a display function such as a television or a screen. The liquid crystal panel includes: an array substrate and a cover plate facing each other, and a liquid crystal layer disposed between the array substrate and the cover plate. The array substrate is the array substrate described in the foregoing embodiments.

It should be noted that, in the case that the liquid crystal panel is a liquid crystal handwriting board, the cover plate includes a flexible base and a common electrode disposed on the side of the flexible base close to the array substrate; and in the case that the liquid crystal panel is a liquid crystal display panel, the cover plate is a color filter substrate.

It should be noted that in the drawings, the dimensions of layers and regions may be exaggerated for clarity of illustration. It is to be further understood that when an element or layer is referred to as being "on" another element or layer, it may be directly on other elements, or an intermediate layer may be present. Additionally, it is to be understood that when an element or layer is referred to as being "under" another element or layer, it may be directly under other elements, or more than one intermediate layer or element may be present. Additionally, it is to be understood that when a layer or element is referred to as being "between" two layers or two elements, it may be the unique layer between the two layers or two elements, or more than one intermediate layer or element may be present. Similar reference numerals indicate similar elements throughout.

In the present disclosure, the terms "first" and "second" are merely used for descriptive purposes, and shall not be construed as indicating or implying any relative importance. The term "a plurality of" refers to two or more, unless explicitly specified otherwise.

Described above are merely optional embodiments of the present disclosure, and are not intended to limit the present disclosure. Within the spirit and principles of the disclosure, any modifications, equivalent substitutions, improvements, and the like are within the protection scope of the present disclosure.

The invention claimed is:

1. An array substrate, having a display region and a non-display region at a periphery of the display region, the array substrate comprising:
 a base and a plurality of patterned film layer structures laminated on the base; wherein a portion of the patterned film layer structure disposed in the display region has a plurality of normal display regions arranged in an array and a first spliced display region between adjacent two normal display regions;

the patterned film layer structure in a same layer comprises a plurality of groups of scale patterns, wherein a group of scale patterns comprises two scale structures, the two scale structures are respectively disposed in adjacent two normal display regions, and in a direction perpendicular to a length direction of the first spliced display region between the adjacent two normal display regions, a distance between the two scale structures is equal to a width of the first spliced display region.

2. The array substrate according to claim 1, wherein in the direction perpendicular to the length direction of the first spliced display region between the adjacent two normal display regions, the distance between the two scale structures is greater than 0.

3. The array substrate according to claim 1, wherein at least some of the plurality of patterned film layer structures form a plurality of sub-pixels; wherein orthographic projections of at least portions of the two scale structures on the base are respectively within orthographic projections of two sub-pixels of the plurality of sub-pixels on the base, and the two sub-pixels are arranged in a row direction or a column direction of the plurality of sub-pixels.

4. The array substrate according to claim 3, wherein a film layer structure closest to the base in the plurality of patterned film layer structures is a first conductive layer; wherein the scale structure in the first conductive layer comprises: a first strip-shaped structure, wherein length directions of the two first strip-shaped structures in a group of scale patterns are parallel.

5. The array substrate according to claim 4, wherein the scale structure in the first conductive layer further comprises: at least one protruding structure connected to the first strip-shaped structure; wherein a number of the at least one protruding structure in the first strip-shaped structure is within a preset number range.

6. The array substrate according to claim 5, wherein the scale structure comprises a plurality protruding structures, and the plurality of protruding structures and the first strip-shaped structure form a comb-shaped structure.

7. The array substrate according to claim 4, wherein the scale structures in film layer structures other than the first conductive layer in the plurality of patterned film layer structures each comprise: a second strip-shaped structure, wherein a length direction of the second strip-shaped structure is parallel to the length direction of the first strip-shaped structure.

8. The array substrate according to claim 7, wherein the film layer structures other than the first conductive layer in the plurality of patterned film layer structures each comprise a second strip-shaped structure corresponding to a same first strip-shaped structure; wherein an orthographic projection of at least a portion of the same first strip-shaped structure on the base and an orthographic projection of at least a portion of each corresponding second strip-shaped structure on the base are within an orthographic projection of a same sub-pixel on the base, and the orthographic projection of the first strip-shaped structure on the base is not overlapped with the orthographic projection of each corresponding second strip-shaped structure on the base.

9. The array substrate according to claim 8, wherein the orthographic projections of the second strip-shaped structures in different patterned film layer structures on the base are not overlapped with each other.

10. The array substrate according to claim 7, wherein the film layer structures other than the first conductive layer in the plurality of patterned film layer structures are respectively: an active layer pattern, a second conductive layer, a first insulating layer, a pixel electrode layer, a second insulating layer and a support pattern, wherein the active layer pattern, the second conductive layer, the first insulating layer, the pixel electrode layer, the second insulating layer and the support pattern are sequentially laminated in a direction perpendicular to and away from the base;

the array substrate further comprises: a gate insulating layer disposed in an entire layer between the active layer pattern and the first conductive layer;

the second strip-shaped structures in the active layer pattern, the second conductive layer, the pixel electrode layer and the support pattern are strip-shaped protrusions; and the second strip-shaped structures in the first insulating layer and the second insulating layer are strip-shaped grooves.

11. The array substrate according to claim 10, wherein a length of the second strip-shaped structure in the support pattern is greater than a length of the first strip-shaped structure, and in the direction perpendicular to the length direction of the first spliced display region between the adjacent two normal display regions, a distance between the two second strip-shaped structures in the group of scale patterns is less than a width of one sub-pixel.

12. The array substrate according to claim 11, wherein an orthographic projection of a portion of the second strip-shaped structure in the support pattern on the base and an orthographic projection of a corresponding first strip-shaped structure on the base are within an orthographic projection of a same sub-pixel on the base; an orthographic projection of another portion of the second strip-shaped structure in the support pattern on the base and an orthographic projection of a corresponding first strip-shaped structure on the base are within orthographic projections of different sub-pixels on the base, and orthographic projections of other portions of the two second strip-shaped structures in the group of scale patterns on the base are within orthographic projections of a same sub-pixel on the base.

13. The array substrate according to claim 10, wherein the first conductive layer further comprises: a gate electrode of a thin film transistor in the sub-pixel and a gate line electrically connected to the gate electrode;

the active layer pattern further comprises: an active layer of the thin film transistor in the sub-pixel;

the second conductive layer further comprises: a first electrode and a second electrode of the thin film transistor in the sub-pixel and a data line electrically connected to the first electrode;

the first insulating layer is further provided with a connection via;

the pixel electrode layer further comprises a pixel electrode in the sub-pixel, wherein the pixel electrode is electrically connected to the second electrode through the connection via;

the support pattern further comprises a plurality of support pillars arranged in an array.

14. The array substrate according to claim 13, wherein a pixel electrode of which an orthographic projection on the base is overlapped with an orthographic projection of the second strip-shaped structure in the pixel electrode layer on the base is provided with a hollow structure, and the orthographic projection of the second strip-shaped structure in the pixel electrode layer on the base is within an orthographic projection of the hollow structure on the base.

15. The array substrate according to claim 11, wherein the first conductive layer further comprises an auxiliary signal line; wherein there is an overlapping region between an orthographic projection of the auxiliary signal line on the base and an orthographic projection of the pixel electrode in the sub-pixel on base, and the orthographic projection of the auxiliary signal line on the base is not overlapped with an orthographic projection of the first strip-shaped structure on the base.

16. The array substrate according to claim 1, wherein the group of scale patterns is further provided with two marker structures in one-to-one correspondence with the two scale structures, wherein the scale structure is closer to the first spliced display region than the corresponding marker structure is.

17. The array substrate according to claim 1, wherein at least some of the plurality of patterned film layer structures form a plurality of sub-pixels, and the plurality of sub-pixels comprise: a plurality of first sub-pixels disposed in the display region and a plurality of dummy sub-pixels disposed in the non-display region; wherein an area of an orthographic projection of a pixel electrode in the dummy sub-pixel on the base is greater than an area of an orthographic projection of a pixel electrode in the first sub-pixel on the base.

18. The array substrate according to claim 17, wherein a plurality of first sub-pixels are disposed in the normal display region, and the plurality of sub-pixels further comprise a plurality of second sub-pixels and a plurality of third sub-pixels, wherein the plurality of second sub-pixels are all disposed in the first spliced display region, a portion of the third sub-pixel is disposed in the normal display region, and another portion of the third sub-pixel is disposed in the first spliced display region; wherein an area of an orthographic projection of a pixel electrode in the second sub-pixel on the base is less than or equal to the area of the orthographic projection of the pixel electrode in the first sub-pixel on the base;

in a direction parallel to the length direction of the first spliced display region, a width of the portion of the third sub-pixel disposed in the first spliced display region is less than or equal to a width of the portion of the third sub-pixel disposed in the normal display region.

19. The array substrate according to claim 18, wherein the portion of the patterned film layer structure disposed in the display region further comprises: a second spliced display region, wherein the second spliced display region is between two first spliced display regions arranged along a row direction and between two first spliced display regions arranged along a column direction, and the plurality of sub-pixels further comprise: a fourth sub-pixel disposed in the second spliced display region; wherein an area of an orthographic projection of a pixel electrode in the fourth sub-pixel on the base is less than or equal to the area of the orthographic projection of the pixel electrode in the second sub-pixel on the base.

20. A liquid crystal panel, comprising: an array substrate and a cover plate facing each other, and a liquid crystal layer disposed between the array substrate and the cover plate, wherein the array substrate has a display region and a non-display region at a periphery of the display region, the array substrate comprising:

a base and a plurality of patterned film layer structures laminated on the base; wherein a portion of the patterned film layer structure disposed in the display region has a plurality of normal display regions arranged in an array and a first spliced display region between adjacent two normal display regions;

the patterned film layer structure in a same layer comprises a plurality of groups of scale patterns, wherein a group of scale patterns comprises two scale structures, the two scale structures are respectively disposed in adjacent two normal display regions, and in a direction perpendicular to a length direction of the first spliced display region between the adjacent two normal display regions, a distance between the two scale structures is equal to a width of the first spliced display region.

* * * * *